(12) United States Patent
Hopkins et al.

(10) Patent No.: US 10,923,492 B2
(45) Date of Patent: Feb. 16, 2021

(54) ELEVATIONALLY-EXTENDING STRING OF MEMORY CELLS AND METHODS OF FORMING AN ELEVATIONALLY-EXTENDING STRING OF MEMORY CELLS

(71) Applicant: Micron Technology, Inc., Boise, ID (US)

(72) Inventors: John D. Hopkins, Meridian, ID (US); David Daycock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/494,969

(22) Filed: Apr. 24, 2017

(65) Prior Publication Data
US 2018/0308858 A1  Oct. 25, 2018

(51) Int. Cl.
*H01L 29/76* (2006.01)
*H01L 27/11582* (2017.01)
(Continued)

(52) U.S. Cl.
CPC .... *H01L 27/11582* (2013.01); *H01L 27/1157* (2013.01); *H01L 27/11524* (2013.01); *H01L 27/11556* (2013.01); *H01L 29/1037* (2013.01)

(58) Field of Classification Search
CPC ............ G11C 16/0483; H01L 21/2251; H01L 27/11524; H01L 27/11556; H01L 27/1157; H01L 27/11582; H01L 29/1037
(Continued)

(56) References Cited

U.S. PATENT DOCUMENTS 7,936,004 B2 * 5/2011 Kito ..................... H01L 21/8221
257/324
8,013,389 B2 * 9/2011 Oh ....................... H01L 27/0688
257/202
(Continued)

FOREIGN PATENT DOCUMENTS

| TW | 107113691 | 12/2018 |
| WO | WO 2012/052298 | 4/2012 |
| WO | WO 2017/065869 | 4/2017 |

OTHER PUBLICATIONS

U.S. Appl. No. 15/208,206, filed Jul. 12, 2016, Micron Technology, Inc.

*Primary Examiner* — Jay C Kim
(74) *Attorney, Agent, or Firm* — Wells St. John P.S.

(57) ABSTRACT

A method that is part of a method of forming an elevationally-extending string of memory cells comprises forming an intervening structure that is elevationally between upper and lower stacks that respectively comprise alternating tiers comprising different composition materials. The intervening structure is formed to comprise an elevationally-extending-dopant-diffusion barrier and laterally-central material that is laterally inward of the dopant-diffusion barrier and has dopant therein. Some of the dopant is thermally diffused from the laterally-central material into upper-stack-channel material. The dopant-diffusion barrier during the thermally diffusing is used to cause more thermal diffusion of said dopant into the upper-stack-channel material than diffusion of said dopant, if any, into lower-stack-channel material. Other embodiments, including structure independent of method, are disclosed.

13 Claims, 17 Drawing Sheets

(51) Int. Cl.
 *H01L 27/11524* (2017.01)
 *H01L 27/11556* (2017.01)
 *H01L 27/1157* (2017.01)
 *H01L 29/10* (2006.01)

(58) Field of Classification Search
 USPC .......................................................... 257/314
 See application file for complete search history.

(56) References Cited

U.S. PATENT DOCUMENTS

| | | | | |
|---|---|---|---|---|
| 8,063,438 B2* | 11/2011 | Son | .................... | H01L 27/11578 |
| | | | | 257/328 |
| 8,247,863 B2* | 8/2012 | Fukuzumi | ......... | H01L 27/11578 |
| | | | | 257/324 |
| 8,278,170 B2* | 10/2012 | Lee | .................... | H01L 27/11551 |
| | | | | 257/E21.645 |
| 8,293,601 B2* | 10/2012 | Kito | .................... | H01L 21/8221 |
| | | | | 257/E21.667 |
| 8,309,405 B2* | 11/2012 | Yang | ................. | H01L 27/11582 |
| | | | | 438/156 |
| 8,455,940 B2* | 6/2013 | Lee | .................... | H01L 27/11565 |
| | | | | 257/288 |
| 8,592,873 B2* | 11/2013 | Kim | .................... | H01L 27/11582 |
| | | | | 257/213 |
| 8,883,611 B2* | 11/2014 | Lee | ....................... | H01L 21/764 |
| | | | | 438/421 |
| 8,981,458 B2* | 3/2015 | Lee | .................... | H01L 27/11551 |
| | | | | 257/324 |
| 9,076,879 B2* | 7/2015 | Yoo | .................... | H01L 27/1157 |
| 9,130,054 B2* | 9/2015 | Jang | ........................ | H01L 29/792 |
| 9,177,965 B2* | 11/2015 | Lee | .................... | H01L 27/11582 |
| 9,190,490 B2 | 11/2015 | Koval et al. | | |
| 9,209,199 B2* | 12/2015 | Simsek-Ege | ...... | H01L 27/11582 |
| 9,276,011 B2* | 3/2016 | Simsek-Ege | ........ | H01L 27/1158 |
| 9,276,133 B2* | 3/2016 | Kim | .................... | H01L 27/11582 |
| 9,343,475 B2* | 5/2016 | Jang | .................. | H01L 27/11582 |
| 9,478,558 B2* | 10/2016 | Koka | ................ | H01L 27/11582 |
| 9,525,065 B1* | 12/2016 | Kyeon | ................ | H01L 29/7827 |
| 9,570,463 B1 | 2/2017 | Zhang et al. | | |
| 9,653,565 B2* | 5/2017 | Jang | ....................... | H01L 29/495 |
| 9,698,153 B2* | 7/2017 | Liu | .................... | H01L 29/66825 |
| 9,761,601 B2* | 9/2017 | Ishibashi | ............. | H01L 27/1157 |
| 9,773,806 B1* | 9/2017 | Lee | .................... | H01L 27/11582 |
| 9,842,839 B1* | 12/2017 | Sills | ..................... | H01L 27/1082 |
| 9,842,849 B1* | 12/2017 | Yamasaki | .......... | H01L 27/11568 |
| 9,935,114 B1* | 4/2018 | Chavan | ............. | H01L 27/11507 |
| 10,014,305 B2* | 7/2018 | Ramaswamy | .......... | H01L 28/90 |
| 10,038,007 B2* | 7/2018 | Lee | .................... | H01L 27/11551 |
| 10,083,981 B2* | 9/2018 | Daycock | ............ | H01L 27/11582 |
| 10,229,927 B2* | 3/2019 | Lee | .................... | H01L 27/11582 |
| 10,256,252 B1* | 4/2019 | Kanazawa | ........ | H01L 27/11582 |
| 10,263,006 B2* | 4/2019 | Kim | .................... | H01L 27/11556 |
| 2009/0173981 A1* | 7/2009 | Nitta | ....................... | H01L 21/84 |
| | | | | 257/302 |
| 2012/0306090 A1 | 12/2012 | Smith et al. | | |
| 2013/0341701 A1 | 12/2013 | Blomme et al. | | |
| 2014/0001530 A1 | 1/2014 | Song | | |
| 2014/0061747 A1 | 3/2014 | Tanzawa et al. | | |
| 2015/0118811 A1 | 4/2015 | Makala et al. | | |
| 2015/0221347 A1 | 8/2015 | Koval et al. | | |
| 2015/0270280 A1 | 9/2015 | Simsek-Ege et al. | | |
| 2015/0279855 A1 | 10/2015 | Lu et al. | | |
| 2015/0333143 A1 | 11/2015 | Meldrim | | |
| 2016/0104715 A1 | 4/2016 | Pachamuthu et al. | | |
| 2016/0104717 A1* | 4/2016 | Lu | ....................... | G11C 16/0483 |
| | | | | 365/185.22 |
| 2016/0276365 A1 | 9/2016 | Choi | .................. | H01L 27/11582 |
| 2017/0236836 A1* | 8/2017 | Huo | ........................ | H01L 28/00 |
| | | | | 257/324 |
| 2018/0019255 A1* | 1/2018 | Hopkins | ........... | H01L 27/11582 |

* cited by examiner

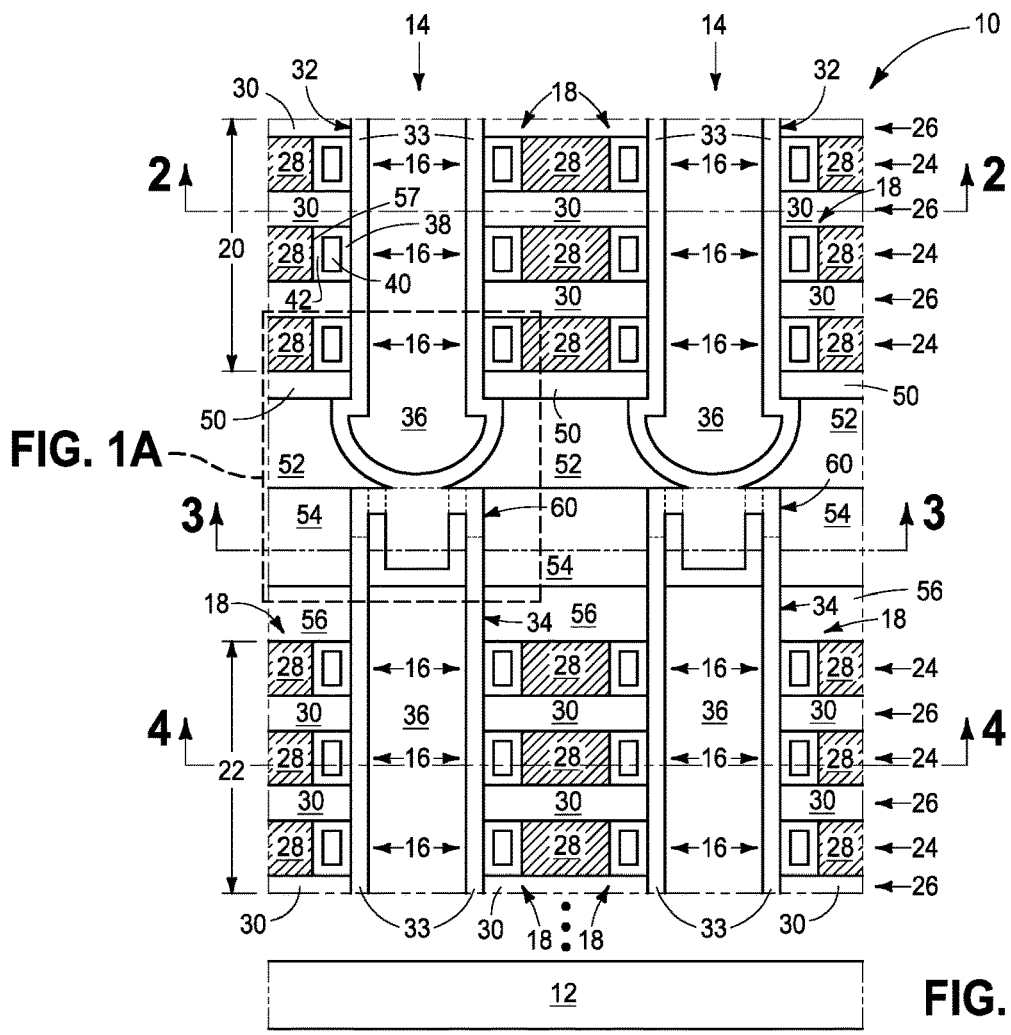
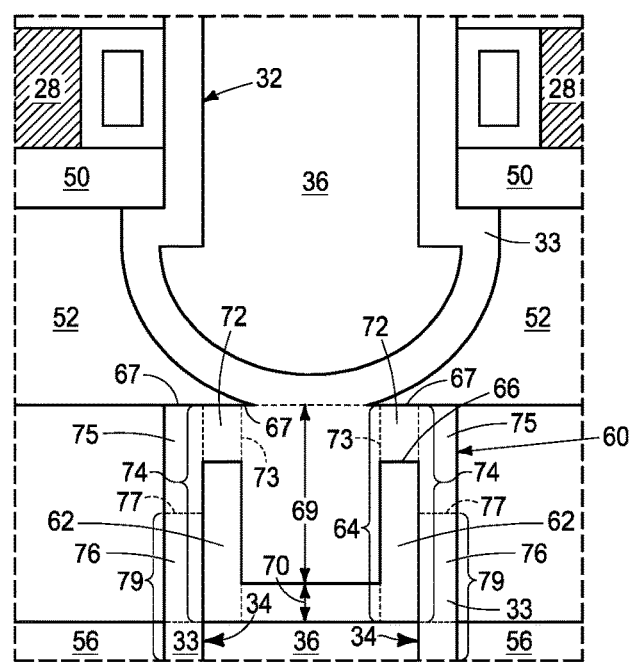
FIG. 1
FIG. 1A

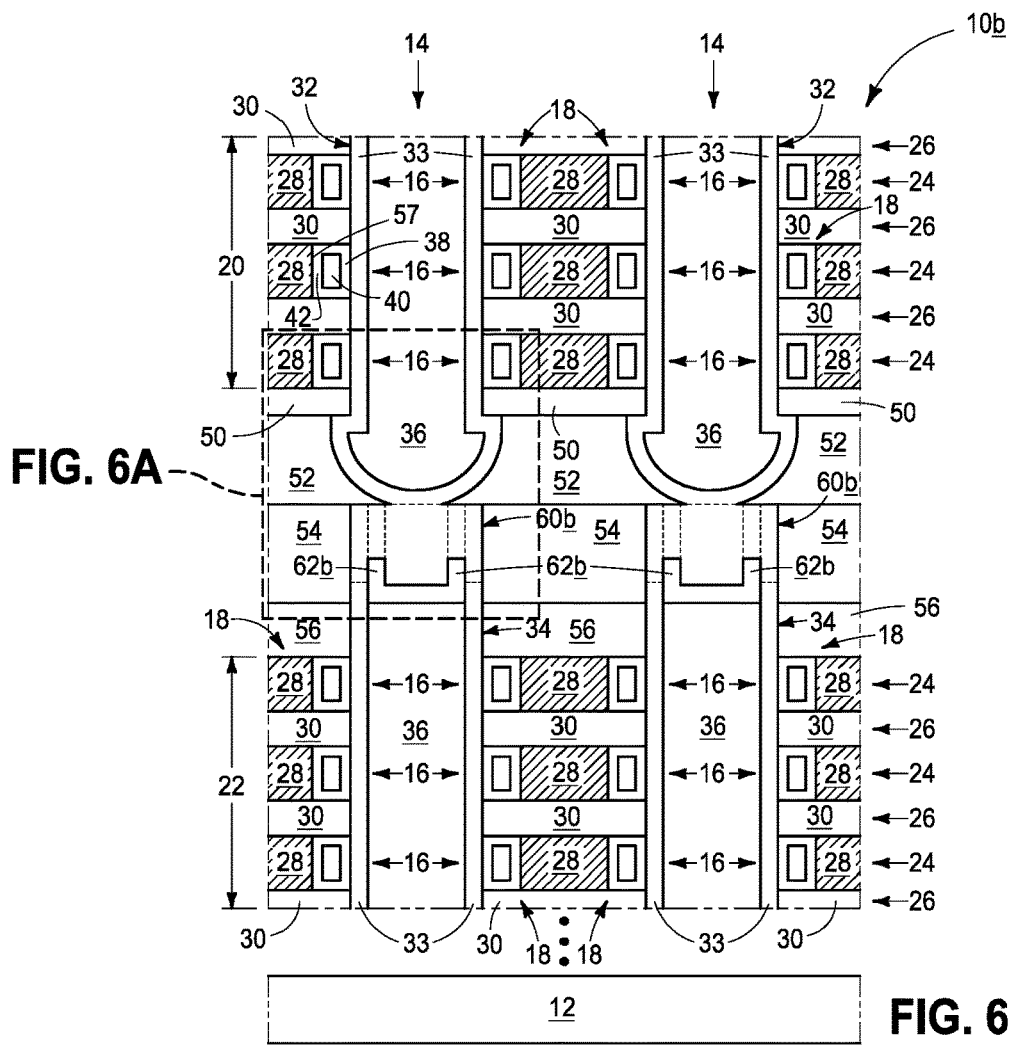
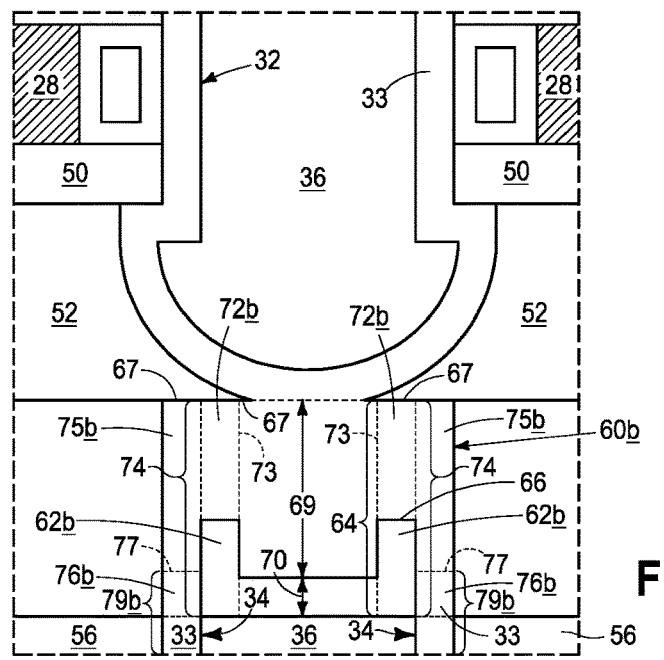
FIG. 6
FIG. 6A

ELEVATIONALLY-EXTENDING STRING OF MEMORY CELLS AND METHODS OF FORMING AN ELEVATIONALLY-EXTENDING STRING OF MEMORY CELLS

TECHNICAL FIELD

Embodiments disclosed herein pertain to elevationally-extending strings of memory cells and to methods of forming such.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Memory cell strings may be arranged to extend horizontally or vertically. Vertical memory cell strings reduce horizontal area of a substrate occupied by the memory cells in comparison to horizontally-extending memory cell strings, albeit typically at the expense of increased vertical thickness. Vertical memory cell strings are usually fabricated in multiple stacks or decks which facilitates the manufacturing thereof. Each stack includes vertically-alternating tiers comprising control gate material of individual charge-storage transistors that vertically alternate with insulating material. A channel pillar extends through each of the stacks and a conductive interconnect electrically couples the channels of immediately elevationally adjacent channel pillars together. Conductively-doped polysilicon is one example material for the conductive interconnect. Such may, for example, be conductively doped with phosphorus (an n-type material). The phosphorus can diffuse above and below the polysilicon into the upper and lower stack channel materials. More may diffuse down than up which can adversely impact programmable memory cells in the elevationally outermost portion of the lower stack.

BRIEF DESCRIPTION OF THE DRAWINGS

FIG. 1 is a diagrammatic sectional view of a portion of an elevationally-extending string of memory cells in accordance with an embodiment of the invention.

FIG. 1A is an enlarged portion of FIG. 1, and an outline of which is shown in FIG. 1.

FIG. 6 is a diagrammatic sectional view of a portion of an elevationally-extending string of memory cells in accordance with an embodiment of the invention.

FIG. 6A is an enlarged portion of FIG. 6, and an outline of which is shown in FIG. 6.

DETAILED DESCRIPTION OF EXAMPLE EMBODIMENTS

Figure 2:
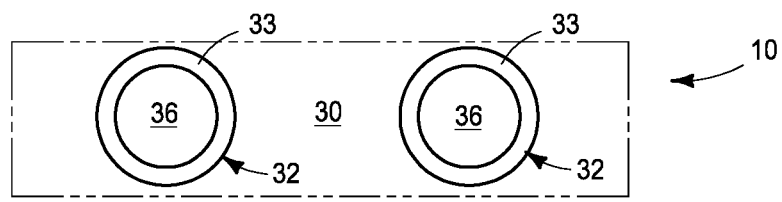
FIG. 2 is a sectional view taken through line 2-2 in FIG. 1.
Figure 3:
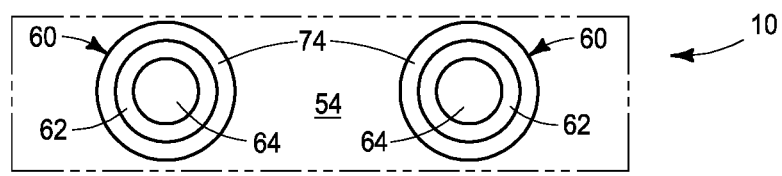
FIG. 3 is a sectional view taken through line 3-3 in FIG. 1.
Figure 4:
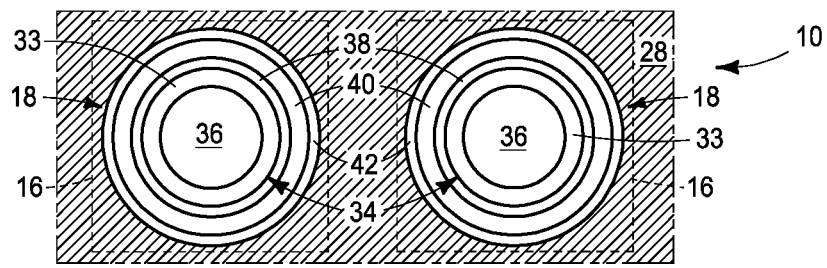
FIG. 4 is a sectional view taken through line 4-4 in FIG. 1.

Embodiments of the invention encompass an elevationally-extending string of memory cells and methods of forming an elevationally-extending string of memory cells.

A first embodiment elevationally-extending string of memory cells is shown and described with reference to FIGS. 1-4. Such includes a construction 10 comprising a base substrate 12 that may include any one or more of conductive/conductor/conducting (i.e., electrically herein), semiconductive, or insulative/insulator/insulating (i.e., electrically herein) materials. In this document, a conductor/conductive/conducting material or region (including a conductively-doped semiconductor/semiconductive/semiconducting material or region) is conductive by having compositional intrinsic conductivity of at least 1 Siemen/cm (i.e., at 20° C. everywhere herein) as opposed to conductivity that could occur by movement of positive or negative charges through a thin material that is otherwise intrinsically insulative or semiconductive. Further, and by way of example only, a maximum conductance may be $1 \times 10^4$ Siemens/cm. An insulator/insulative/insulating/dielectric material or region is insulative by having compositional intrinsic conductivity of no greater than $1 \times 10^{-10}$ Siemen/cm (i.e., it is electrically resistive as opposed to being conductive or semiconductive). Further, and by way of example only, a minimum conductance may be $1 \times 10^{-12}$ Siemen/cm. A semiconductor/semiconductive/semiconducting material or region that is not doped to be conductive is semiconductive by having compositional intrinsic conductivity of less than 1 Siemen/cm and greater than $1 \times 10^{-10}$ Siemen/cm.

Various materials are shown above base substrate 12. Materials may be aside, elevationally inward, or elevationally outward of the FIGS. 1-4-depicted materials. For example, other partially or wholly fabricated components of integrated circuitry may be provided somewhere above, about, or within substrate 12. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array.

Construction 10 is shown as comprising two elevationally-extending strings 14 of memory cells 16 individually comprising a programmable charge-storage-field effect transistor 18. Construction 10 comprises an upper stack or deck 20 that is elevationally over a lower stack or deck 22. Upper and lower stacks 20, 22 individually comprise vertically-alternating tiers 24, 26 comprising control-gate material 28 (in tiers 24) of individual charge-storage transistors 18 alternating with insulating material 30 (in tiers 26). Example conductive compositions for control gate material 28 are one or more of elemental metal, a mixture or alloy of two or more elementals, conductive metal compounds, and conductively-doped semiconductive materials. Example insulating compositions for material 30 are one or more of silicon dioxide and silicon nitride. Example thicknesses for materials 28 and 30 are 350 Angstroms and 200 Angstroms, respectively.

Only a few alternating tiers 24, 26 are shown with respect to each stack 20, 22, although each stack would likely have dozens or more of each of tiers 24 and 26. Additionally, only two stacks 20 and 22 are shown, although one or more additional stacks (not shown) may also be provided. Further and regardless, each stack need not be fabricated identically relative another stack nor include identical materials. Regardless, any construction in accordance with the invention will have some upper stack 20 and an adjacent lower stack 22. Transistors 18 in one or more tiers in the lowest part of upper stack 20 and uppermost part of lower stack 22 may be "dummy" which may or may not store data. Further, an array of memory cells will likely include many more than two elevationally-extending strings 14. The description largely proceeds with respect to construction and method associated with a single string 14, although others if not all strings within an array will likely have the same attributes. In some embodiments, elevationally-extending string 14 is vertical or within 10° of vertical.

An upper-stack-channel pillar 32 extends through multiple of vertically-alternating tiers 24, 26 in upper stack 20. A lower-stack-channel pillar 34 extends through multiple of vertically-alternating tiers 24, 26 in lower stack 22. Channel pillars 32 and 34 are shown as comprising channel material 33 and as being hollow channel pillars that are internally filled with insulator material 36 (e.g., silicon dioxide and/or silicon nitride). Alternately, one or both of the upper and lower-stack-channel pillars may be non-hollow, for example comprising channel material extending completely diametrically-across the pillar (e.g., no internal insulator material 36 and not shown). Regardless, the channel pillar material 33 ideally comprises doped semiconductive material (e.g., polysilicon) having channel-conductivity-modifying dopant(s) present in a quantity that produces intrinsic semiconductor properties enabling the upper and lower channel pillars to operably function as switchable "on" and "off" channels for the individual memory cells for control-gate voltage above and below, respectively, a suitable threshold voltage (Vt) depending on programming state of the charge-storage transistor for the respective individual memory cell. An example such dopant quantity is from $5 \times 10^{17}$ atoms/cm$^3$ to $5 \times 10^{18}$ atoms/cm$^3$. Channel material 33 may be p-type or n-type. Channel material 33 may be semiconductive having conductivity of less than 1 Siemen/cm and greater than $1 \times 10^{-10}$ Siemen/cm (i.e., intrinsic to the material at 0 Volt gate field).

Insulative-charge-passage material 38 (e.g., one or more of silicon dioxide and silicon nitride), charge-storage material 40 (e.g., material suitable for use in floating gates or charge-trapping structures, such as, for example, one or more of silicon, silicon nitride, nanodots, etc.), and a charge-blocking region 42 are laterally between upper/lower-stack-channel pillars 32, 34, respectively, and control-gate material 28 in tiers 24. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. Such a charge-blocking region is laterally (e.g., radially) outward of charge-passage material 38 and laterally (e.g., radially) inward of conductive-control-gate material 28. An example charge-blocking region as shown comprises insulator material 42 (e.g., one or more of silicon nitride, silicon dioxide, hafnium oxide, zirconium oxide, etc.). By way of further examples, a charge-blocking region may comprise a laterally (e.g., radially) outer portion of the charge-storage material (e.g., material 40) where such charge-storage material is insulative (e.g., in the absence of any different-composition material between insulative-charge-storage material 40 and control-gate material 28). Regardless, as an additional example, an interface of a charge-storage material and conductive material of a control gate may be sufficient to function as a charge-blocking region in the absence of any separate-composition-insulator material (e.g., in the absence of material 42). Further, an interface 57 of control-gate material 28 with material 42 (when present) in combination with insulator material 42 may together function as a charge-blocking region, and as alternately or additionally may a laterally-outer region of an insulative-charge-storage material (e.g., a silicon nitride material 40).

Base substrate 12 may comprise conductively-doped semiconductive material comprising source lines (not shown) connecting with a lowest-stack-channel pillar and which may comprise a portion of circuitry for the vertical string of memory cells. Additionally, a conductive line (not shown) may connect with an uppermost-stack-channel pillar and which may comprise a portion of circuitry for the elevationally-extending string of memory cells.

Individual memory cells 16 may comprise other alternate or yet-to-be-developed constructions that include an elevationally-extending-upper-stack-channel pillar and an elevationally-extending-lower-stack-channel pillar, and may be fabricated by any method. For example, and by way of example only, construction 10 has memory cell materials 38, 40, and 42 elevationally between underlying and overlying insulator material 30. Such may be manufactured by a so-called "gate first" process whereby an opening in which the channel pillar is formed is first-formed through alternating tiers of conductive material 28 and insulator material 30. Conductive material 28 is then laterally recessed back from sidewalls of that opening by isotropic etching, followed by deposition of materials 42, 40, and 38 into the annular recesses so formed. Such materials are then etched to remove them from being outside of the annular recesses, followed by deposition of the channel material. Alternately, only materials 42 and 40 may be deposited into the recesses, followed by deposition of insulative-charge-passage material 38 and then deposition of the channel material (e.g., after etching materials 42 and 40 from being within the opening outside of the annular recesses).

Alternately and by way of example only, the memory cells may be fabricated such that materials 38, 40, and 42 are not elevationally between (not shown) insulator material 30 that is in different tiers 26, for example by a so-called "gate last" or "replacement gate" process. There, a stack may be manufactured to comprise tiers of vertically-alternating different composition insulating materials, and an opening for the channel material is then formed there-through. Then, materials 42, 40, and 38 are deposited as circumferential linings in such opening, followed by deposition of the channel material into the opening. Then, slits are etched through the stack to produce a desired control gate pattern, and one of the insulator materials is isotropically etched away to leave void space elevationally between the other insulating material (e.g., 30) that is in different tiers. The conductive control gate material is there-after conformally deposited to fill the slits and void spaces, followed by anisotropic etching of the conductive material from the slits, thus leaving patterned control gates. Also and regardless, construction 10 is shown as comprising a single memory cell 16 about the channel pillar in each tier 24 in a string 14.

Alternately, and by way of example only, any existing or yet-to-be-developed construction may be used wherein two or more memory cells are circumferentially spaced about the channel in a single tier in a given string (not shown).

A plurality of materials is shown elevationally between upper stack 20 and lower stack 22. Such might be fabricated separately from the fabrication of upper stack 20 and lower stack 22, or may be fabricated in whole or in part when fabricating upper stack 20 and/or lower stack 22. Accordingly, unless otherwise stated, one or more of such intervening materials might be considered as part of one or both of upper stack 20 and lower stack 22. Such intervening materials are shown as including different insulating materials 50 (e.g., 100 Angstroms of $SiO_2$), 52 (e.g., 540 Angstroms of $Al_2O_3$), 54 (e.g., 600 Angstroms of $Si_3N_4$), and 56 (e.g., 200 Angstroms of $SiO_2$). Upper-stack-channel pillar 32 is shown as having a lower portion thereof that bulges radially outward within or into dielectric material 52, which may occur as an artifact of manufacture wherein insulator material 52 is wet isotropically etched to expose material there-below before forming channel pillar 32.

An intervening structure 60 is elevationally between upper stack 20 and lower stack 22. In some embodiments, intervening structure 60 is a conductive interconnect which electrically couples upper-stack-channel pillar 32 and lower stack-channel pillar 34 together. In the context of this document, a conductive interconnect has at least some conductive material between the upper and lower stacks which electrically couples the upper and lower channel pillars together. In one embodiment and as shown, a conductive interconnect 60 comprises an elevationally-extending-dopant-diffusion barrier 62 (FIG. 1A) and a laterally-central material 64 (i.e., at least some of which is laterally central relative to conductive interconnect 60), with barrier 62 being laterally outward of central material 64. In one embodiment and as shown, barrier 62 comprises an elevationally-extending cylinder.

In one embodiment, laterally-central material 64 has an uppermost region 69 that is conductive. In one embodiment, laterally-central material 64 has a lowermost region (e.g., a base 70) which may be conductive, semiconductive, or insulative and, regardless, in one embodiment comprises a laterally-extending-dopant-diffusion barrier. Example uppermost region 69 is shown extending elevationally inward to region/base 70, although uppermost region 69 may be elevationally less thick, for example only in an uppermost fraction of conductive interconnect 60 that is less than half of the elevation of conductive interconnect 60, and may for example only be that portion of material 64 that is higher than surface 66 of diffusion barrier 62. Regardless, in one embodiment, uppermost region 69 comprises conductively-doped semiconductive material (e.g., polysilicon). Alternately by way of example only, material 69 might comprise metal material (e.g., TiN, WN, Ti, W, Cu, etc.) and which may include dopant therein. In one embodiment and as shown, upper-stack-channel pillar 32 is directly against conductive-uppermost region 69 of central material 64. Additionally or alternately considered, a lowest portion of upper channel material 33 may be conductively-doped semiconductive material, for example which has been conductively doped with conductivity-enhancing dopant from thermal diffusion of conductivity-enhancing dopant present in uppermost region 69 into the lowest portion of upper channel material 33 (i.e., when conductivity-enhancing dopant to material 33 is in uppermost region 69). Thereby, and regardless of how such occurred, and in one embodiment, uppermost region 69 and conductive interconnect 60 may extend upwardly (not shown) into what is shown as the lowest portion of upper channel material 33 of upper-stack-channel pillar 32.

In one embodiment, base 70 has dopant-diffusion-barrier properties (i.e., it blocks diffusion of dopant there-through) and is directly against and extends laterally between cylindrical sidewalls of dopant-diffusion barrier 62. Accordingly, base 70 of laterally-central material 64 may have dopant-diffusion-barrier properties in some embodiments. In one embodiment, diffusion barrier 62 is insulative (e.g., silicon dioxide, silicon nitride, aluminum oxide, hafnium oxide, etc.) and in one embodiment base 70 is insulative. In one embodiment, diffusion barrier 62 has an elevationally-outermost surface 66 that is lower than an elevationally-outermost surface 67 of conductive interconnect 60.

Topping material 72 is above elevationally-outermost surface 66, and in one embodiment directly there-against, of diffusion barrier 62. In some embodiments, topping material 72 is conductive and would be so in the embodiment of FIGS. 1-4. In one embodiment, topping material 72 is dopant transmissive, for example as may occur by thermal diffusion of a conductivity-modifying dopant from a dopant-containing uppermost region/material 69 as described in more detail below. Topping material 72 may be of the same or different composition as that of upper region 69 of central material 64, with example same composition being shown by a dashed interface line 73 between upper region 69 and topping material 72. In one embodiment and as shown, topping material 72 comprises a cylinder. In one embodiment and as shown, upper-stack-channel pillar 32 is not directly against topping material 72, and yet may be so in other embodiments.

Side material 74 extends elevationally laterally outward of diffusion barrier 62, and is at least one of conductive and semiconductive. In one embodiment, side material 74 from top to bottom is conductive, in one embodiment from top to bottom is semiconductive, and in one embodiment is both conductive and semiconductive (e.g., it has different stacked regions that are individually one of conductive and semiconductive). Example conductive-side materials include conductively-doped-semiconductive material and metal material. Example semiconductive material includes undoped silicon or doped silicon having a dopant concentration below a threshold whereby the material becomes conductive as defined above.

In one embodiment, side material 74 has an elevationally-outermost region that is conductive, and in one such embodiment has an elevationally-innermost region that is semiconductive. Where semiconductive, such elevationally-innermost region may be an upwardly-extending portion of lower-stack-channel pillar 34. For example, and by way of example only, FIG. 1 shows an example elevationally-outermost region 75 that may be conductive and an elevationally-innermost region 76 that may be semiconductive and comprise an upwardly-extending portion 79 of lower-stack channel pillar 34. An example interface line 77 is shown between outermost region 75 and innermost region 76 to diagrammatically show an example demarcation between regions 75 and 76. However more likely, interface 77 would be a region extending into regions 75 and 76 wherein conductivity-modifying-dopant concentration varies from high to low moving elevationally inward, and in one embodiment.

Figure 5:
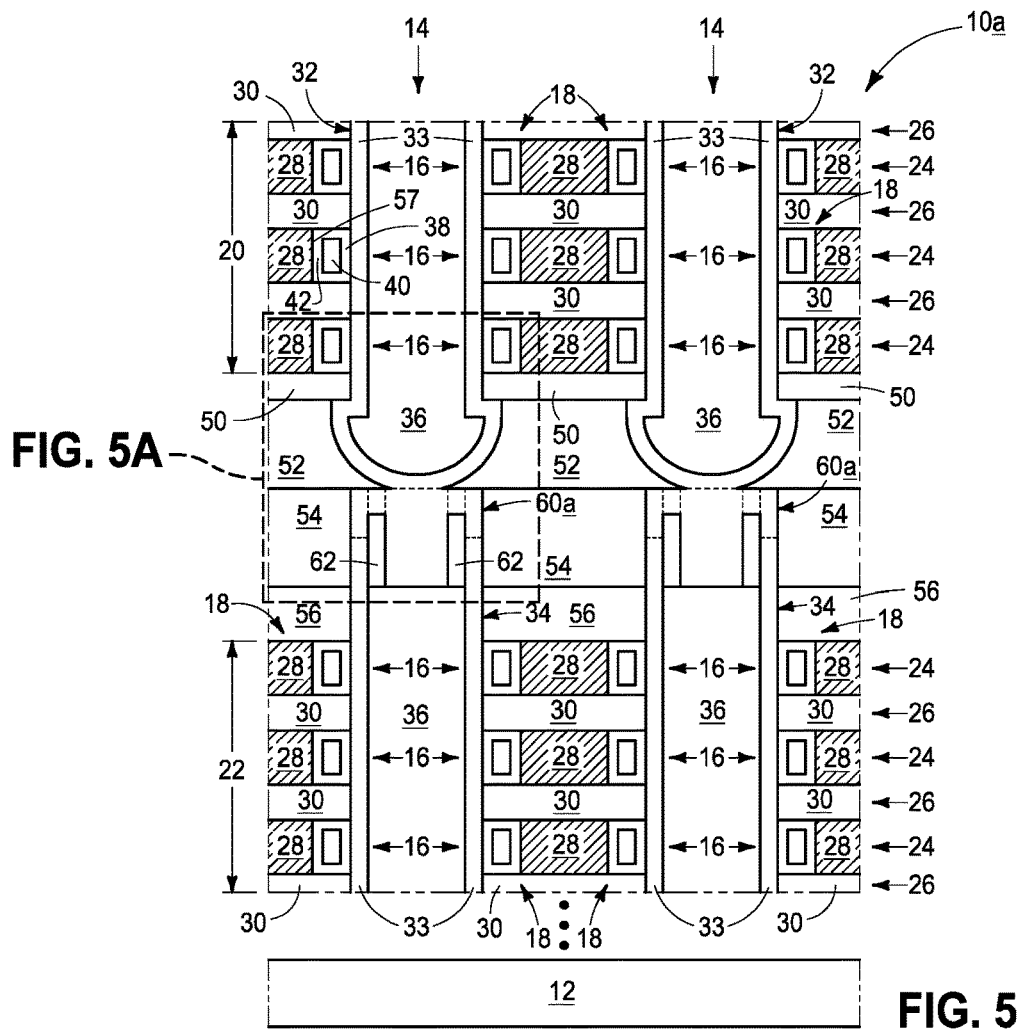
FIG. 5 is a diagrammatic sectional view of a portion of an elevationally-extending string of memory cells in accordance with an embodiment of the invention.
Figure 5A:
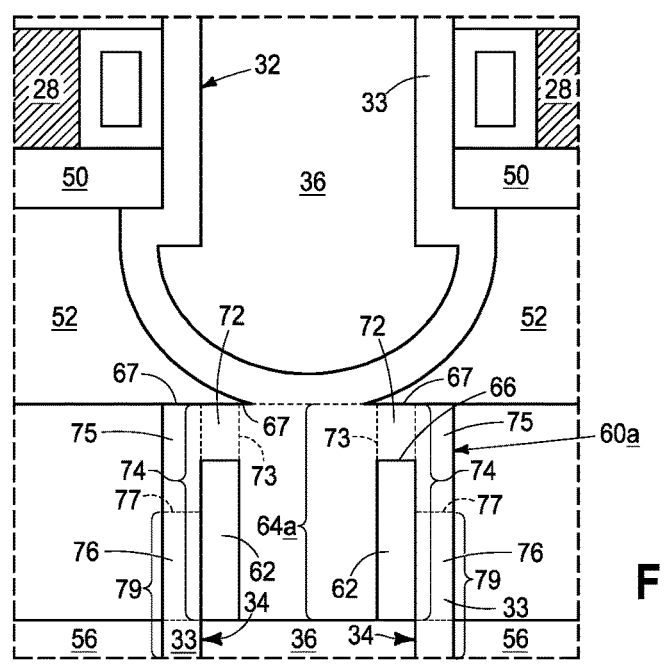
FIG. 5A is an enlarged portion of FIG. 5, and an outline of which is shown in FIG. 5.

An alternate example construction 10a is shown in FIGS. 5 and 5A. Like numerals from the above-described embodiments have been used where appropriate, with some construction differences being indicated with the suffix "a". Intervening structure 60a is shown as having central material 64a that is devoid of bottom/base region 70 that is in FIG. 1. Any other attribute(s) or aspect(s) as shown and/or described herein with respect to other embodiments may be used.

Another example alternate construction 10b is shown in FIGS. 6 and 6A. Like numerals from the above-described embodiments have been used where appropriate, with some construction differences being indicated with the suffix "b". Intervening structure 60b is shown as comprising a diffusion barrier 62b which does not extend elevationally outward to the degree which barriers 62 and 62a do in FIGS. 1-4 and FIGS. 5, 5A, respectively. Elevational thicknesses of regions or materials 72b, 75b, 76b, and 79b may change, for example as shown. Any other attribute(s) or aspect(s) as shown and/or described herein with respect to other embodiments may be used.

Figure 7:
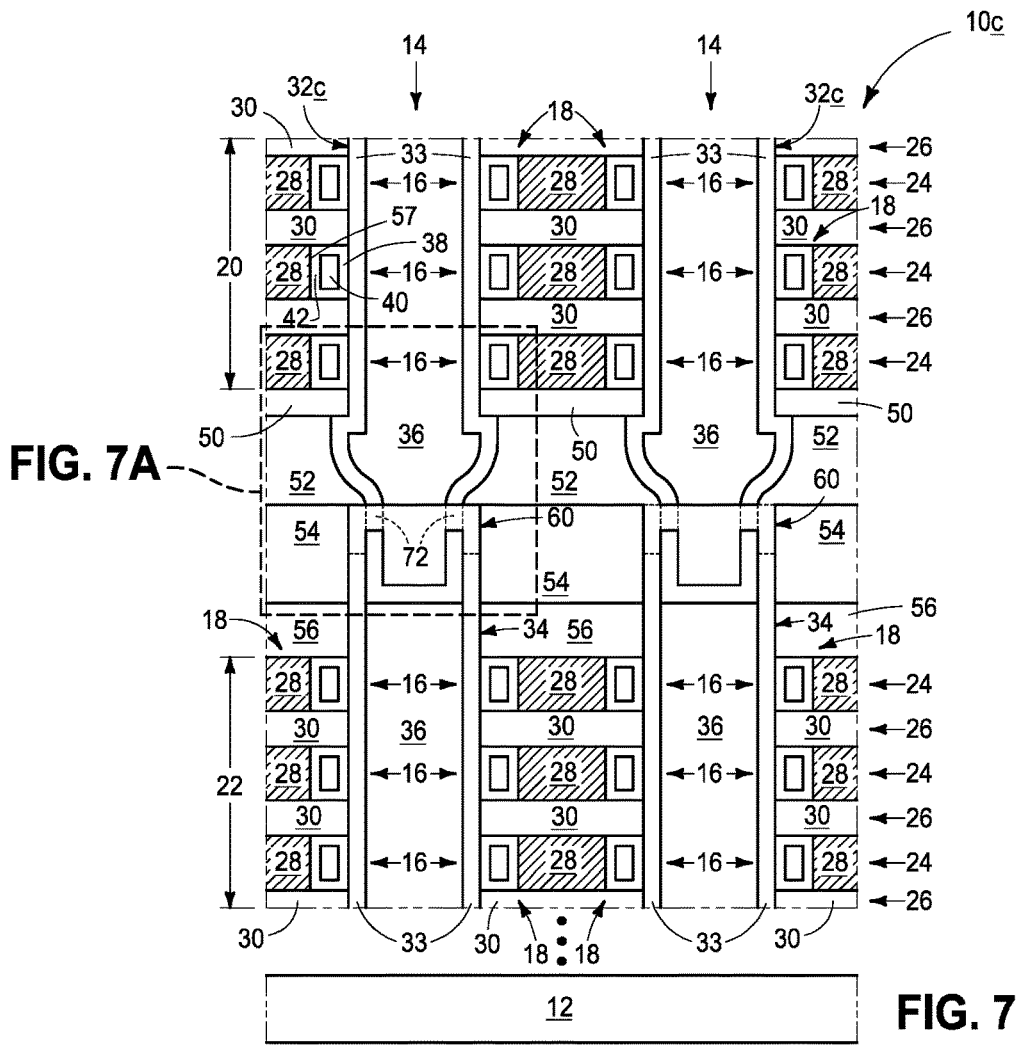
FIG. 7 is a diagrammatic sectional view of a portion of an elevationally-extending string of memory cells in accordance with an embodiment of the invention.
Figure 7A:
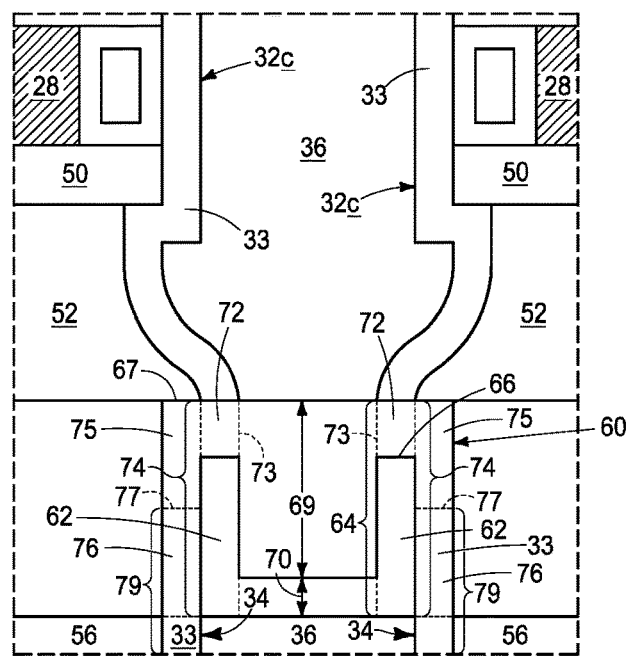
FIG. 7A is an enlarged portion of FIG. 7, and an outline of which is shown in FIG. 7.

Another example alternate embodiment construction 10c is shown in FIGS. 7 and 7A. Like numerals from the above-described embodiments have been used where appropriate, with some construction differences being indicated with the suffix "c". Upper-stack-channel pillar 32c is directly against conductive-topping material 72, and in one such embodiment as shown is not directly against central material 64 (e.g., no material 33 extending between sidewalls of material 33 in the depicted cross-section). In one such embodiment, uppermost region 69 of central material 64 may not be conductive as, for example, upper channel pillar 32c conductively connects with lower channel pillar 34 through a conductive-topping material 72, and regardless of whether an upper region 75 of side material 74 is semiconductive or conductive. Analogously as described above, a lowest portion of upper channel material 33 may be conductively-doped-semiconductive material, for example which has been conductively doped with conductivity-enhancing dopant from thermal diffusion of conductivity-enhancing dopant present in uppermost region 69 and/or into the lowest portion of upper channel material 33. Thereby, and regardless of how such occurred, and in one embodiment, conductive-topping material 72 may extend upwardly (not shown) into what is shown as the lowest portion of upper channel material 33 of upper-stack-channel pillar 32. Any other attribute(s) or aspect(s) as shown and/or described herein with respect to other embodiments may be used.

Figure 8:
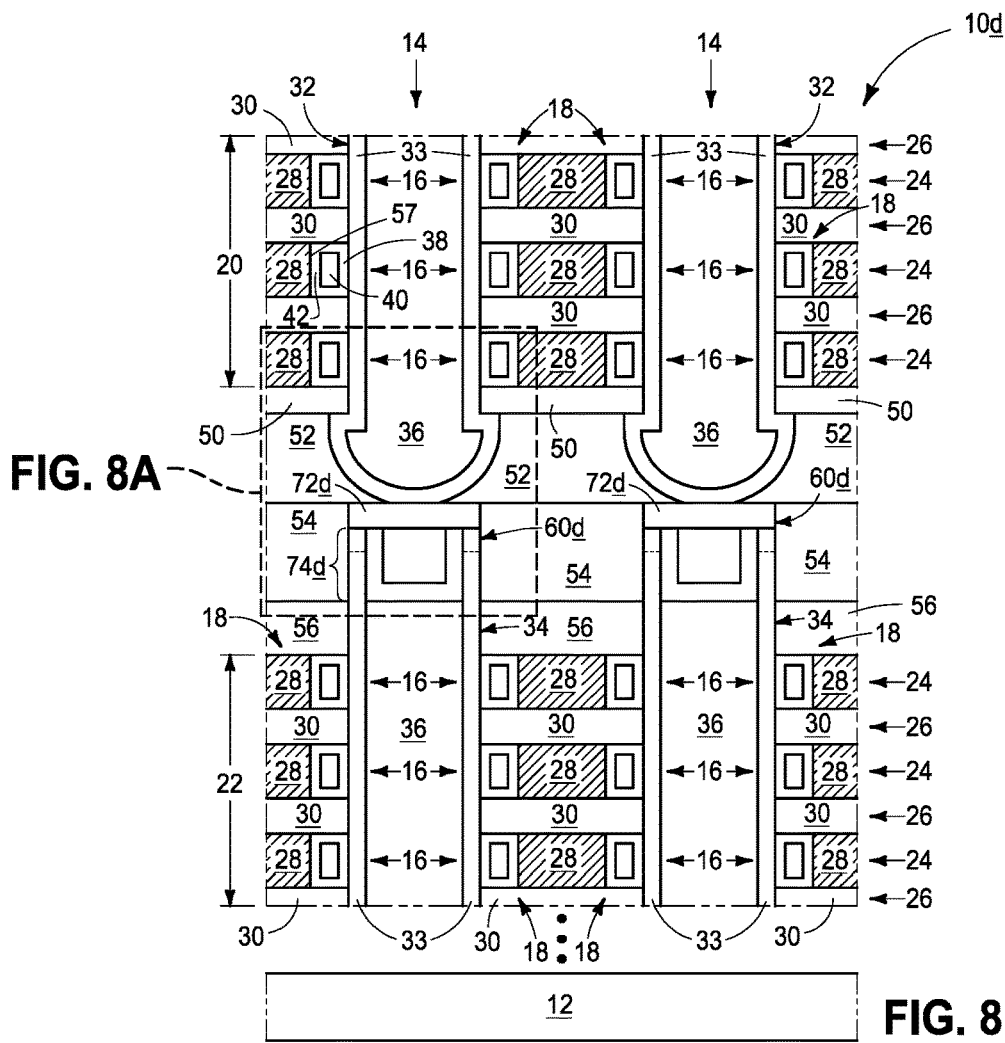
FIG. 8 is a diagrammatic sectional view of a portion of an elevationally-extending string of memory cells in accordance with an embodiment of the invention.
Figure 8A:
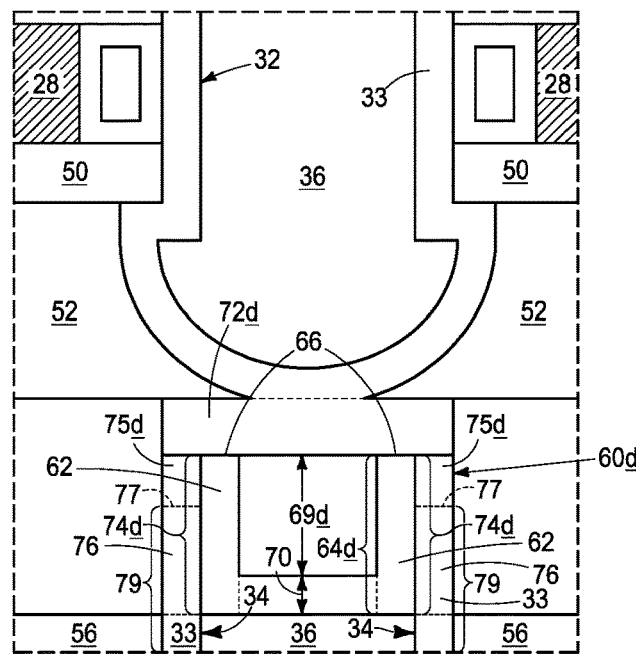
FIG. 8A is an enlarged portion of FIG. 8, and an outline of which is shown in FIG. 8.

Another example embodiment construction 10d is shown in FIGS. 8 and 8A. Like numerals from the above-described embodiments have been used where appropriate, with some construction differences being indicated with the suffix "d". A conductive-topping material 72d extends laterally of elevationally-outermost surface 66 of diffusion barrier 62 above side material 74d and central material 64d (e.g., material 72d is conductive from side-to-side in horizontal cross-section). In one embodiment, topping material 72d comprises metal material and in one embodiment comprises conductively-doped semiconductive material. In one embodiment, side material 74d has an elevationally-innermost region 76 that is semiconductive, and in one such embodiment may comprise a conductive upper region 75d. Any other attribute(s) or aspect(s) as shown and/or described herein with respect to other embodiments may be used.

Figure 9:
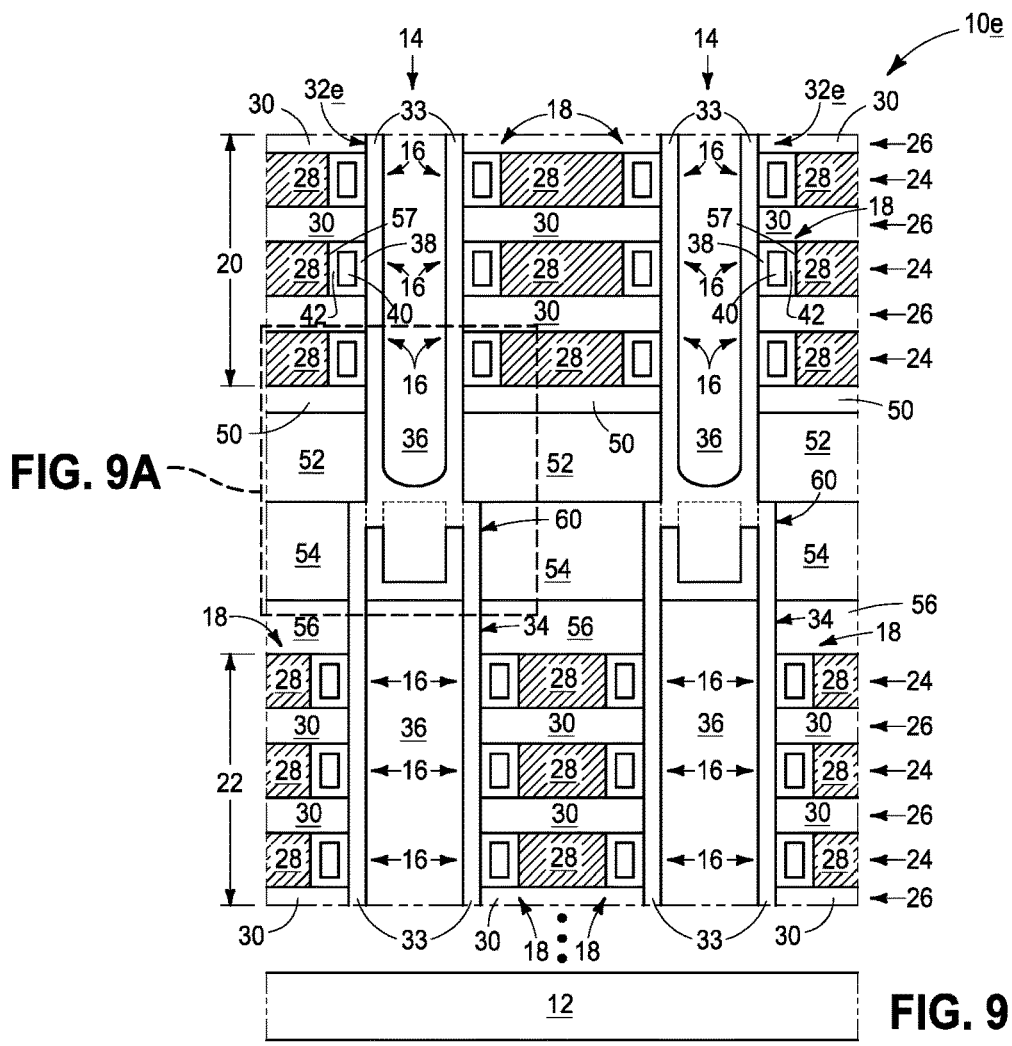
FIG. 9 is a diagrammatic sectional view of a portion of an elevationally-extending string of memory cells in accordance with an embodiment of the invention.
Figure 9A:
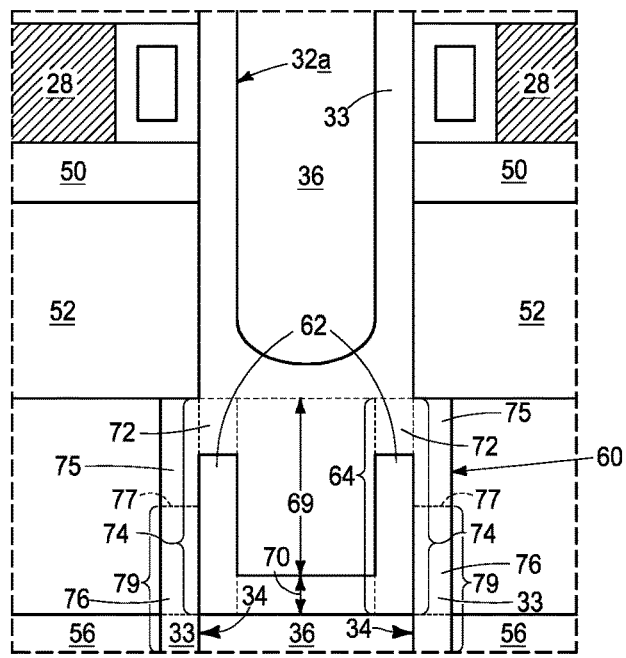
FIG. 9A is an enlarged portion of FIG. 9, and an outline of which is shown in FIG. 9.

Another alternate embodiment construction 10e is shown in FIGS. 9 and 9A. Like numerals from the above-described embodiments have been used where appropriate, with some construction differences being indicated with the suffix "e". FIGS. 9 and 9A show an example wherein upper stack-channel pillar 32e is directly above central material 64 (and conductive-topping material 72) yet is not directly above side material 74. Analogously as described above, a lowest portion of upper channel material 33 may be conductively-doped-semiconductive material, for example which has been conductively doped with conductivity-enhancing dopant from thermal diffusion of conductivity-enhancing dopant present in uppermost region 69 and/or conductive-topping material 72 into the lowest portion of upper channel material 33. Thereby, and regardless of how such occurred, and in one embodiment, conductive-topping material 72 may extend upwardly (not shown) into what is shown as the lowest portion of upper channel material 33 of upper-stack-channel pillar 32. Any other attribute(s) or aspect(s) as shown and/or described herein with respect to other embodiments may be used.

Figure 10:
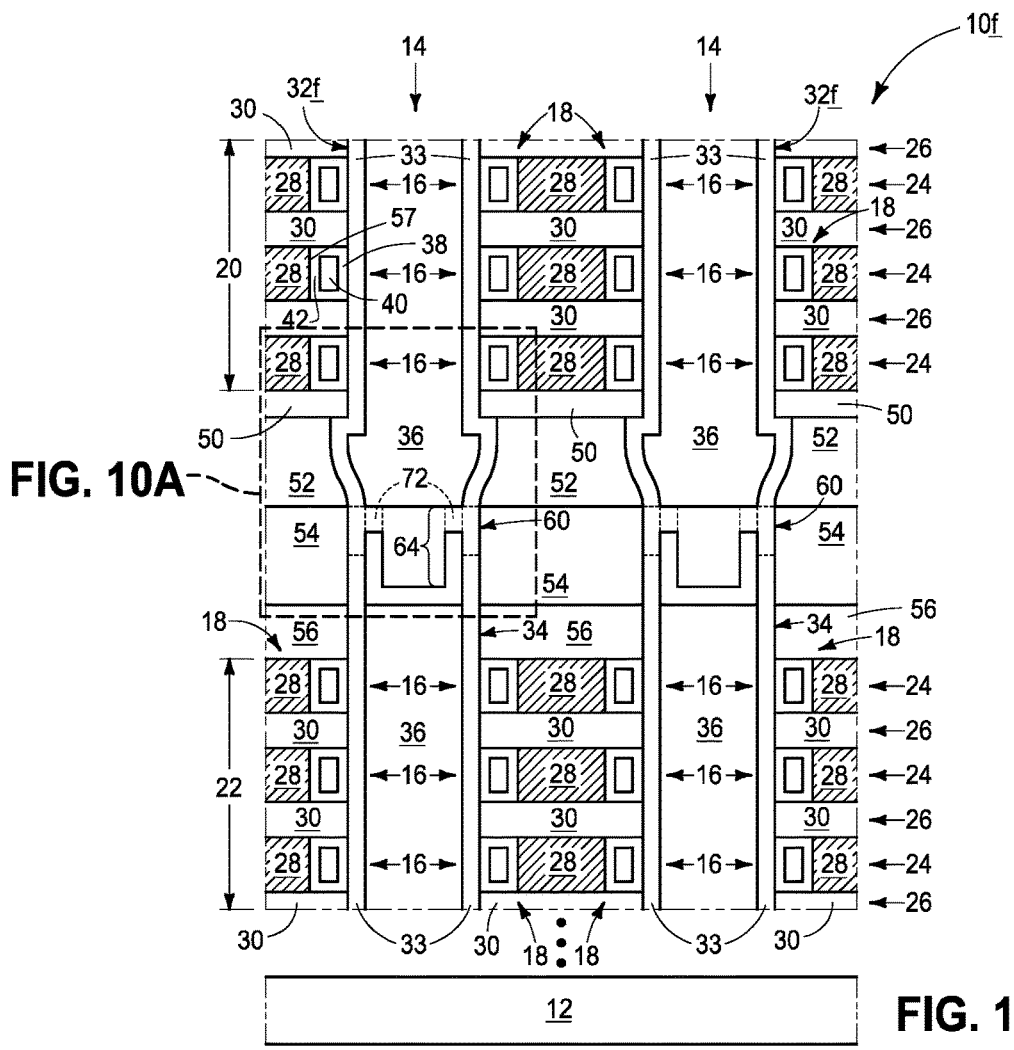
FIG. 10 is a diagrammatic sectional view of a portion of an elevationally-extending string of memory cells in accordance with an embodiment of the invention.
Figure 10A:
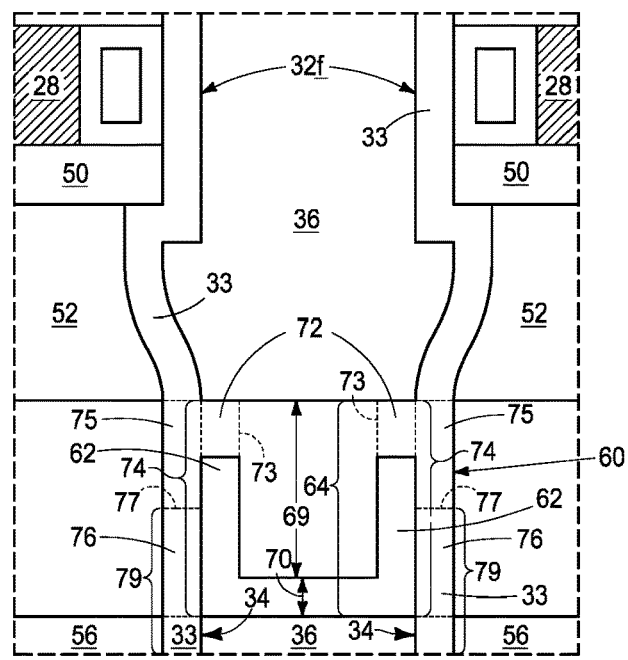
FIG. 10A is an enlarged portion of FIG. 10, and an outline of which is shown in FIG. 10.

Another example embodiment construction 10f is shown in FIGS. 10 and 10A. Like numerals from the above-described embodiments have been used where appropriate, with some construction differences being indicated with the suffix "f". Laterally-central material 64 has conductivity-modifying dopant therein. Conductively-doped-semiconductive material 75 is elevationally between upper-stack-channel pillar 32f and lower-stack-channel pillar 34 aside topping material 72. Topping material 72 may not be conductive in this embodiment, but ideally will be dopant transmissive. In one embodiment, the topping material is conductive. In one embodiment, the conductively-doped-semiconductive material is directly against the topping material. In one embodiment, the conductively-doped-semiconductive material and the topping material are of the same composition. Analogously as described above, a lowest portion of upper channel material 33 may be conductively-doped-semiconductive material, for example which has been conductively doped with conductivity-enhancing dopant from thermal diffusion of conductivity-enhancing dopant present in uppermost region 69 and/or topping material 72 into the lowest portion of upper channel material 33. Thereby, and regardless of how such occurred, and in one embodiment, conductive region 75 may extend upwardly (not shown) into what is shown as the lowest portion of upper channel material 33 of upper-stack-channel pillar 32. Any other attribute(s) or aspect(s) as shown and/or described herein with respect to other embodiments may be used.

Figure 11:
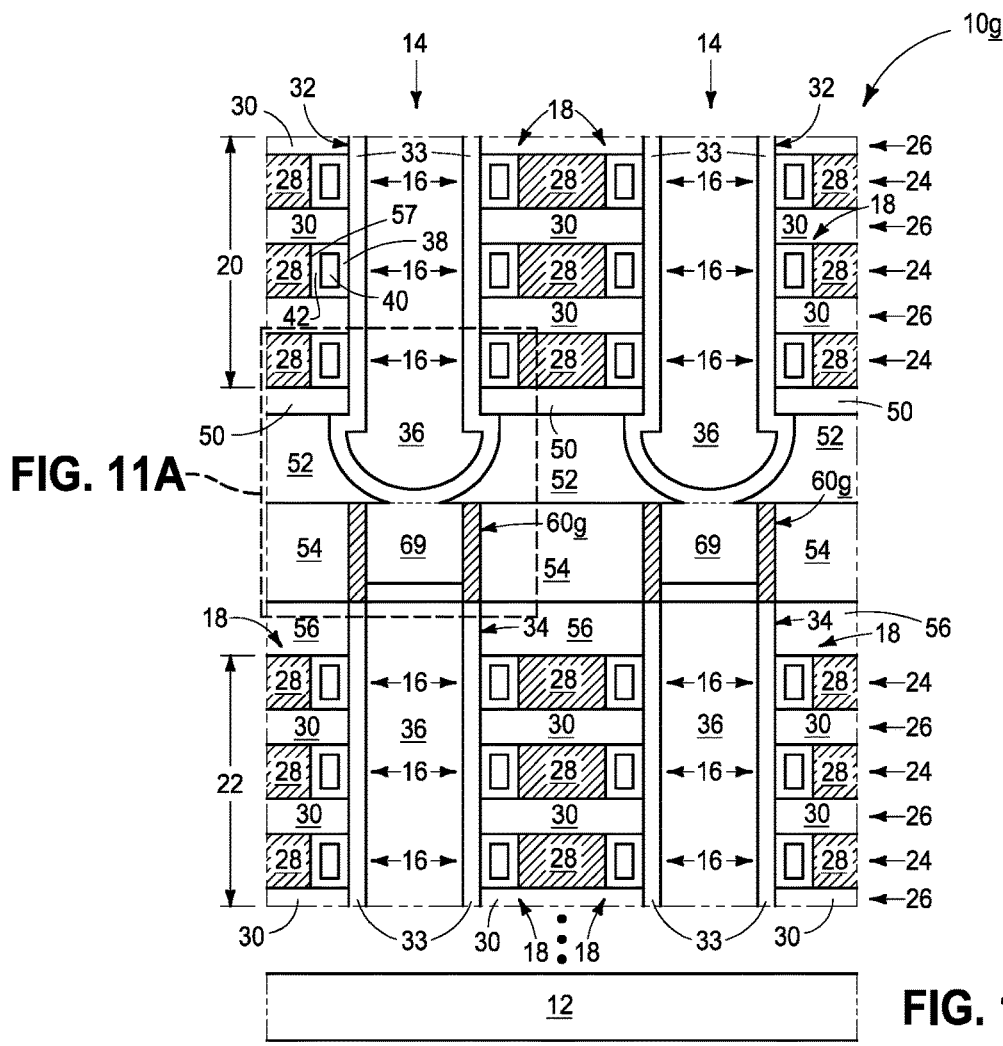
FIG. 11 is a diagrammatic sectional view of a portion of an elevationally-extending string of memory cells in accordance with an embodiment of the invention.
Figure 11A:
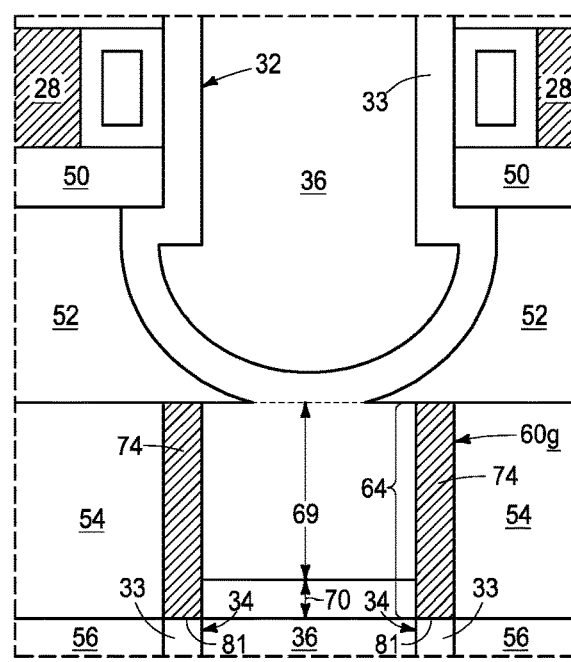
FIG. 11A is an enlarged portion of FIG. 11, and an outline of which is shown in FIG. 11.

Another alternate example embodiment construction 10g is shown in FIGS. 11 and 11A. Like numerals from the above-described embodiments have been used where appropriate, with some construction differences being indicated with the suffix "g". Conductive interconnect 60g comprises conductive-side material 74 laterally outward of and extending elevationally along laterally-central material 64. Lower-stack-channel pillar 34 is directly against conductive-side material 74. By way of examples, side material 74 may comprise metal material and/or may comprise conductively-doped semiconductive material. In one embodiment, lower-stack-channel pillar 34 is directly against an elevationally-innermost surface 81 of side material 74. In one embodiment and as shown, side material 74 comprises an elevationally-extending cylinder. FIG. 11A shows an example embodiment wherein diffusion barrier 62 is not shown, whereas a dopant-diffusion-barrier base/bottom 70 is shown. Any other attribute(s) or aspect(s) as shown and/or described herein with respect to other embodiments may be used.

Embodiments of the invention encompass methods of forming an elevationally-extending string of memory cells including, for example and by way of example only, one or more of the above-identified constructions. Example such embodiments are described with reference to FIGS. 12-26. Like numerals from the above-described embodiments have been used where appropriate, including for predecessor constructions and materials. Any of the method embodiments may have any of the attributes described above with respect to structure embodiments and vice versa.

Figure 12:
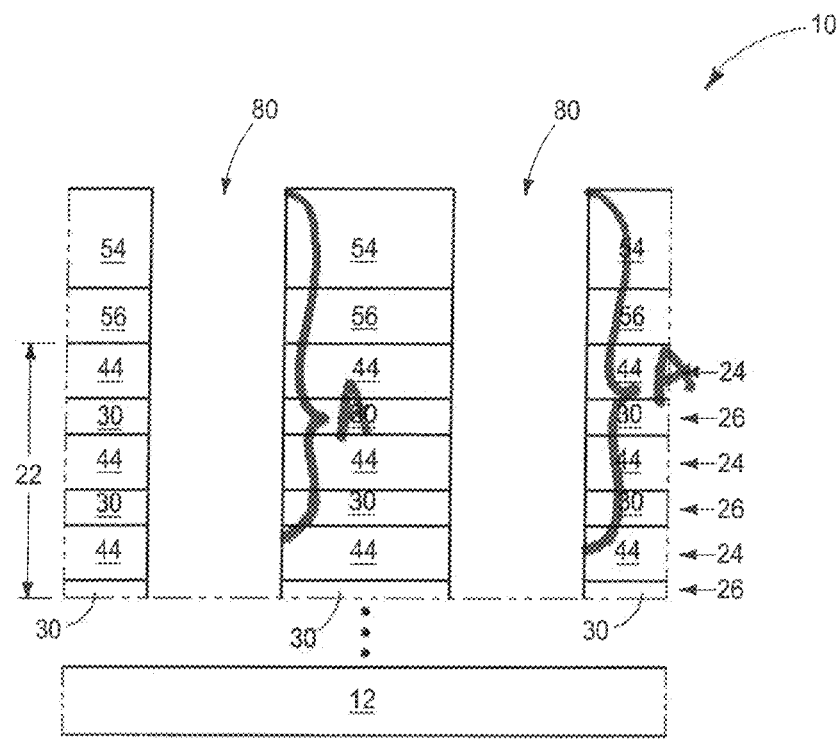
FIG. 12 is a diagrammatic sectional view of a substrate fragment in process in accordance with an embodiment of the invention.

Referring to FIG. 12, lower stack 22 has been formed to comprise first-alternating tiers 24, 26 of first-lower-stack material 44 and second-lower-stack material 30 comprising different compositions. Insulator material 56, 54 has been formed above lower stack 22 and a lower opening 80 has been formed to extend through insulator material 56, 54 and multiple of first-alternating tiers 24, 26.

Figure 13:
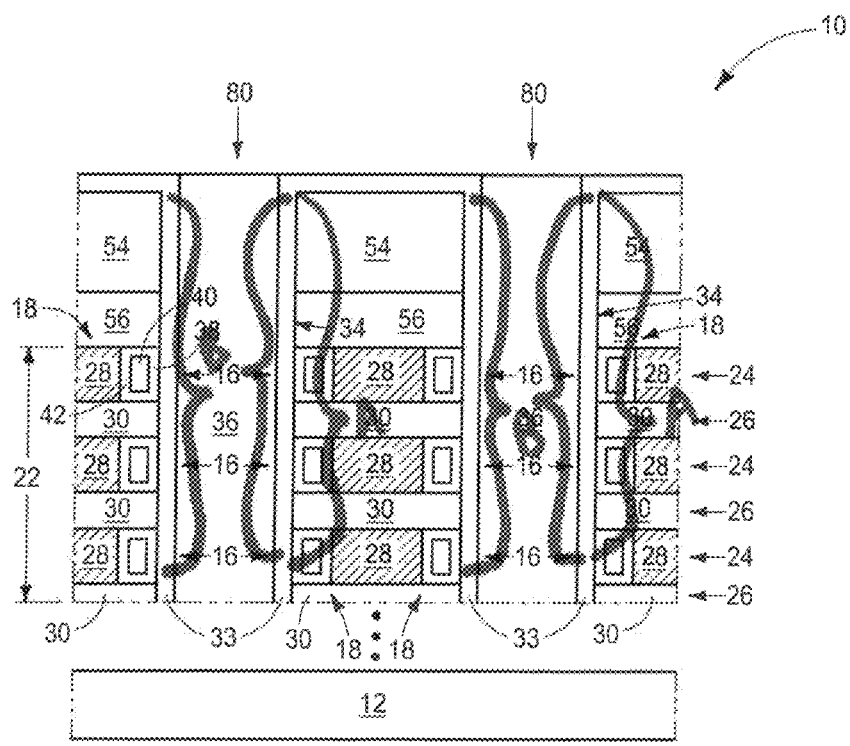
FIG. 13 is a view of the FIG. 12 substrate fragment at a processing step subsequent to that shown by FIG. 12.

Referring to FIG. 13, and by way of example only, material 44 (not shown) has been removed and replaced with materials 28, 42, 40, and 38 as, for example, shown in the FIG. 1 embodiment, and in what may be considered as so called "gate first" processing for example as described above. Alternately, so called "gate last" processing may be used for example as described above. Regardless, lower-stack-channel material 33 has been formed in lower opening 80. Such channel may be formed as a hollow channel or as a solid pillar, however, with material 33 comprising an elevationally-outermost portion that is both against sidewalls of lower opening 80 and less-than-fills an elevationally-outermost portion of lower opening 80. Alternately considered or stated, a lower portion of upper channel material 33 may be a solid pillar extending completely diametrically across lower opening 80 wherein at least an elevationally-outermost portion thereof less-than-fills the elevationally-outermost portion of lower opening 80, for example being cylindrical as shown in FIGS. 1-4. FIG. 13 shows insulator material 36 (e.g., silicon dioxide formed in a spin-on dielectric manner) centrally within lower opening 80.

Figure 14:
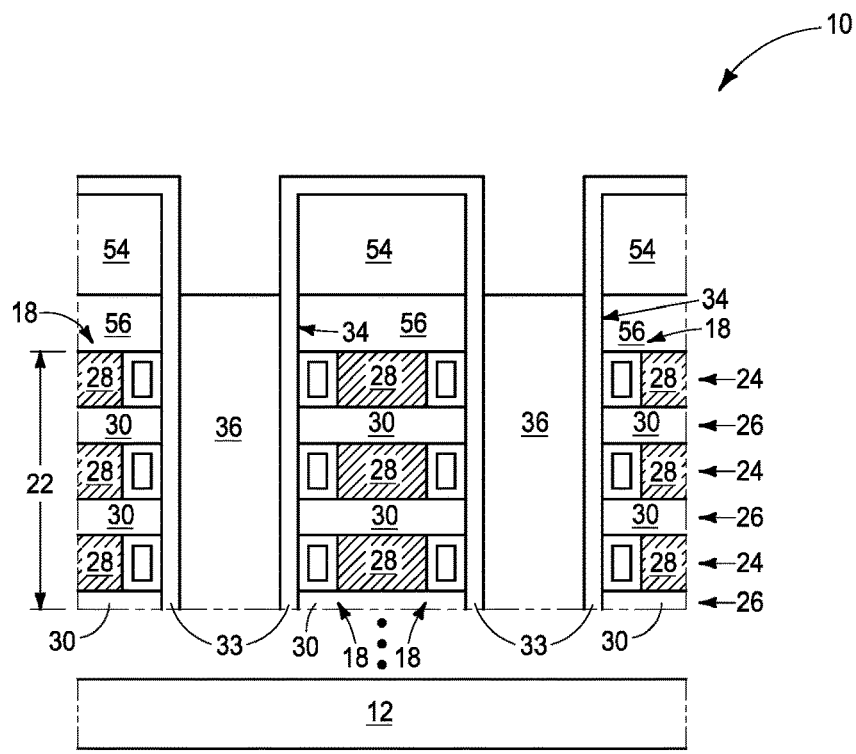
FIG. 14 is a view of the FIG. 13 substrate fragment at a processing step subsequent to that shown by FIG. 13.

Referring to FIG. 14, insulator material 36 has been elevationally recessed (e.g. by isotropic etching) selectively relative to exposed lower-stack-channel material 33.

Figure 15:
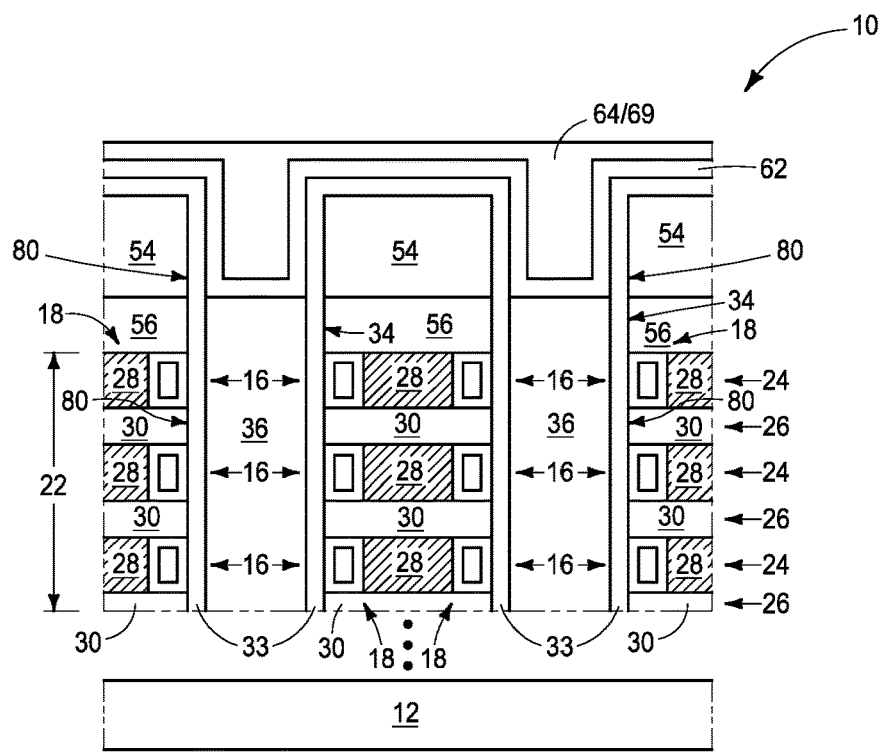
FIG. 15 is a view of the FIG. 14 substrate fragment at a processing step subsequent to that shown by FIG. 14.
Figure 16:
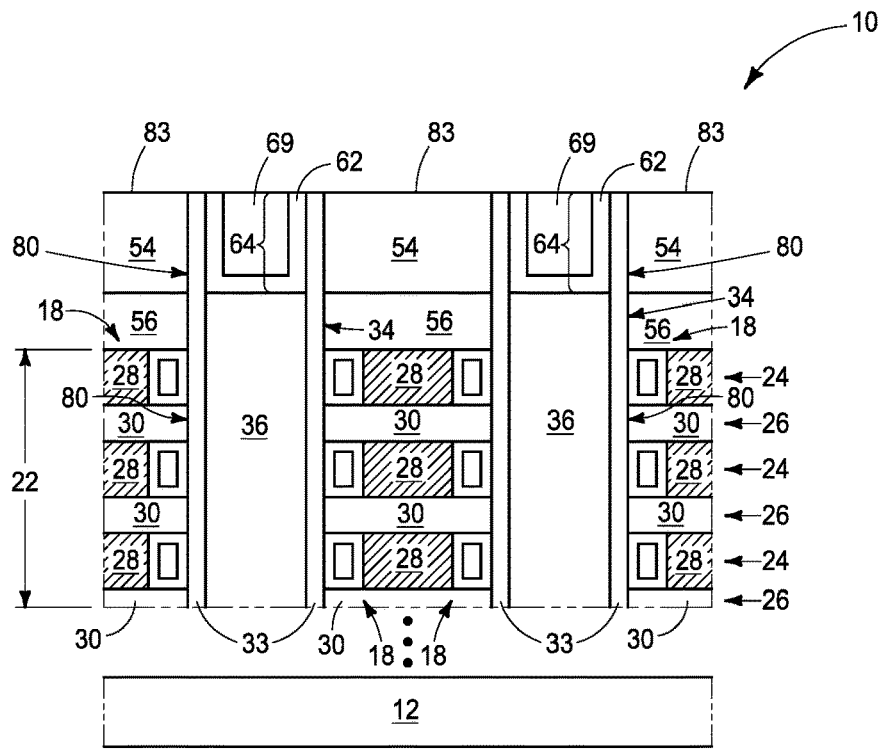
FIG. 16 is a view of the FIG. 15 substrate fragment at a processing step subsequent to that shown by FIG. 15.

Referring to FIG. 15, elevationally-extending-dopant-diffusion barrier material 62 has been formed around lower opening 80 laterally inward of the elevationally-outermost portion of lower-stack-channel material 33. Remaining volume of lower opening 80 has then been filled with laterally-central material 64 laterally inward of diffusion barrier material 62. FIG. 16 shows material 62 and 64 as having been planarized back at least to an elevationally-outmost surface 83 of insulator material 56, 54.

Figure 17:
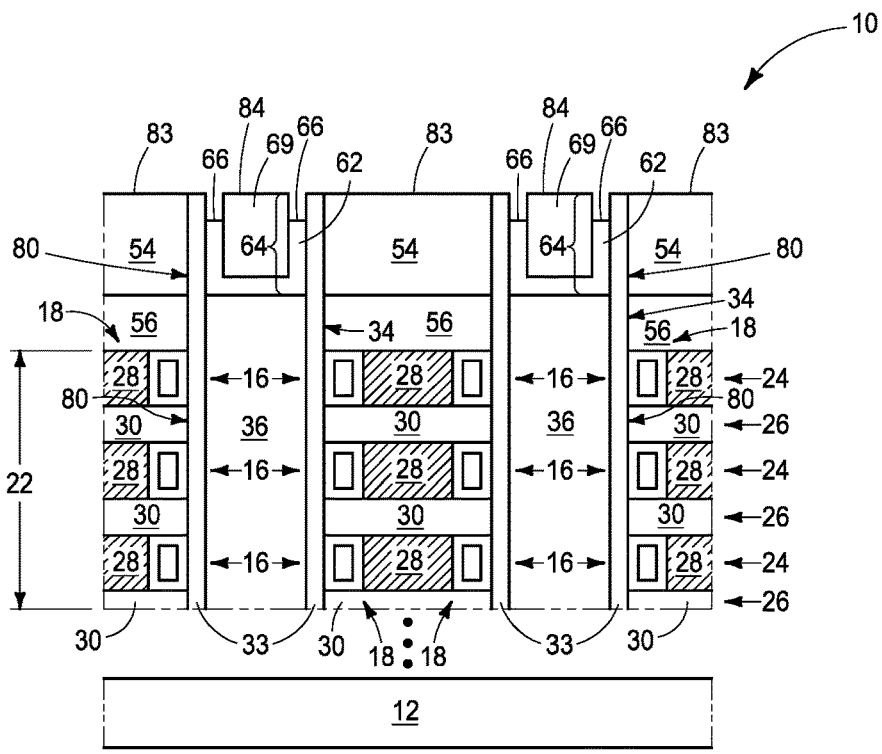
FIG. 17 is a view of the FIG. 16 substrate fragment at a processing step subsequent to that shown by FIG. 16.

Referring to FIG. 17, dopant-diffusion barrier 62 has been elevationally recessed relative to elevationally-outermost surface 83 of insulator material 56, 54 that is adjacent lower opening 80 to form dopant-diffusion-barrier 62 to have an elevationally-outermost surface 66 that is lower than elevationally-outermost surface 83 of insulator material 54, 56 that is adjacent lower opening 80. Such may be accomplished, by way of example, by any suitable wet or dry etching which etches material 62 selectively relative to the other example exposed materials. In one embodiment, the elevationally recessing of dopant-diffusion barrier 62 also elevationally recesses such barrier relative to an elevationally-outermost surface 84 of laterally-central material 64/region 69 whereby barrier surface 66 is lower than central-material surface 84. In one embodiment, the elevationally recessing of dopant-diffusion barrier 62 also elevationally recesses such barrier relative to an elevationally outermost surface of lower-stack-channel material 33 whereby barrier surface 66 is lower than such lower-stack-channel material surface.

Figure 18:
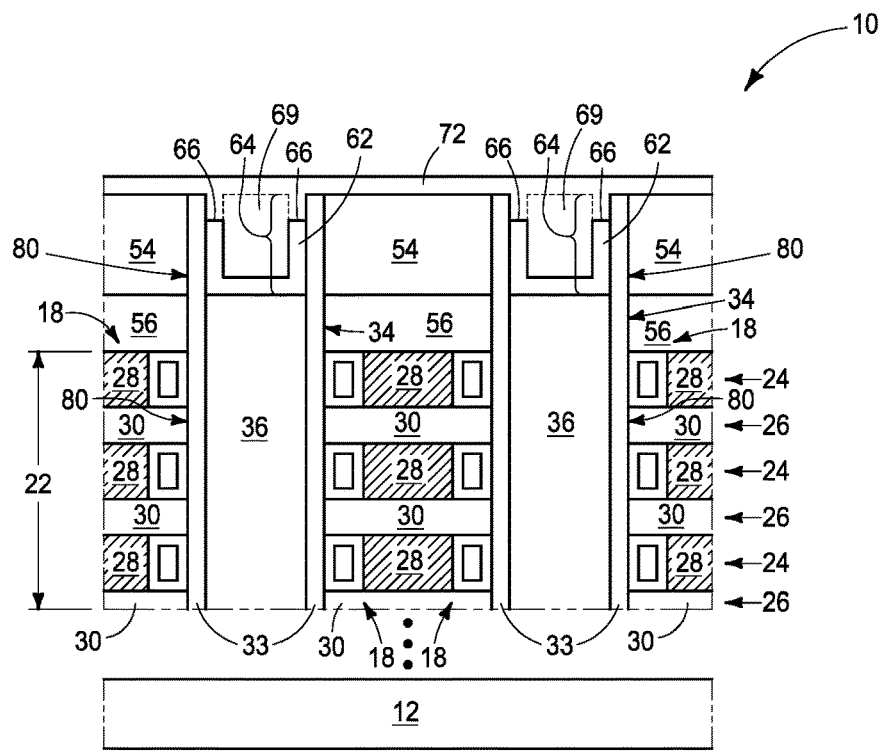
FIG. 18 is a view of the FIG. 17 substrate fragment at a processing step subsequent to that shown by FIG. 17.

Referring to FIG. 18, topping material 72 has been formed above elevationally-outermost surface 66 of recessed dopant-diffusion barrier 62. In one embodiment and as shown, topping material 72 is formed directly against the recessed dopant-diffusion barrier, and in one such embodiment directly against the elevationally-outermost surface 66 of recessed dopant-diffusion barrier 62.

Figure 19:
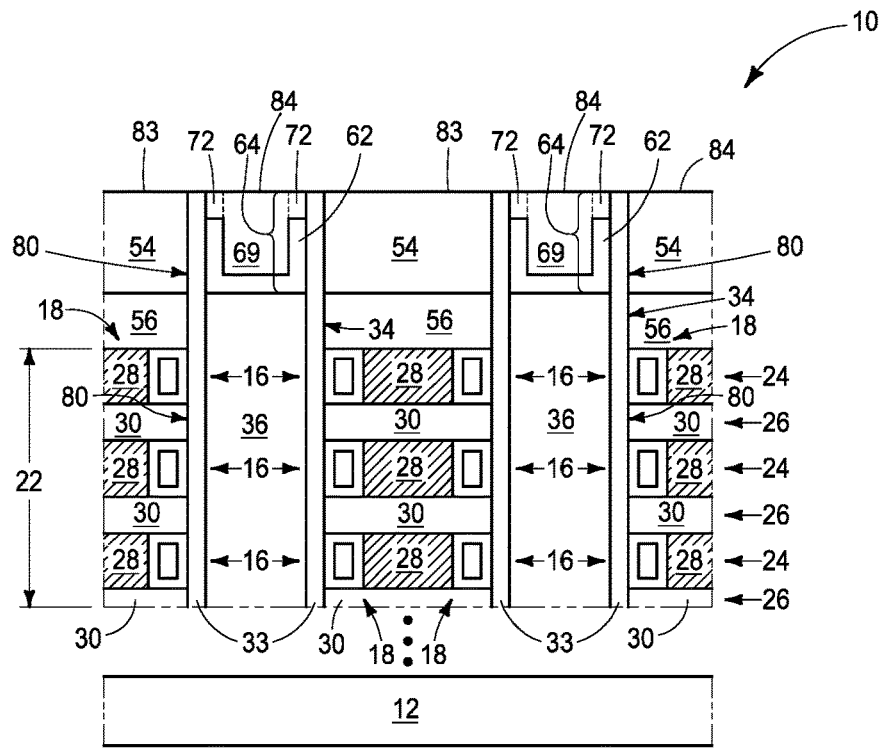
FIG. 19 is a view of the FIG. 18 substrate fragment at a processing step subsequent to that shown by FIG. 18.

Referring to FIG. 19, the construction of FIG. 18 has been planarized back at least to elevationally-outermost surface 83 of insulator material 54, 56.

Subsequent processing analogously includes the forming of an upper stack 20 (FIGS. 1 and 1A) comprising second-alternating tiers 24, 26 comprising different composition first and second-upper-stack materials 44 and 30 elevationally over lower stack 22 and topping material 72. Upper stack 20 has an upper opening extending elevationally through multiple of second-alternating tiers 24, 26 in upper stack 20 and to topping material 72. Upper-stack-channel material 33 is formed in such upper opening, with upper-stack-channel material 33 being ultimately electrically coupled with lower-stack-channel material 33 in lower-stack-channel pillar 34. Alternate constructions to that shown by FIG. 1 may result in method implementations, and regardless of whether "gate first" or "gate last" processing is used. Regardless, control-gate material is provided laterally outward of the respective upper and lower-stack-channel materials. Further provided are insulative-charge-passage material, charge-storage material, and a charge-blocking region of individual of the memory cells laterally between the control-gate material and the respective upper and lower-stack-channel materials.

Processing as described above may additionally occur or be modified slightly to produce, for example, the embodiment of FIGS. 8 and 8A. Specifically, and by way of example only, after filling remaining volume of the lower opening with a laterally-central material that is laterally inward of the dopant-diffusion barrier, both of laterally-central material 64 and lower-stack-channel material 33 may be elevationally recessed relative to elevationally-outermost surface 83 of insulator material 54, 56. Such recessing of central material 64 and lower-stack-channel material 33 may occur while or during elevationally recessing dopant-diffusion barrier 62. Topping material 72*d* could then be formed, and planarized back at least to elevationally-outermost surface 83 of insulator material 54, 56 to produce an intervening construction 60*d* like that shown in FIGS. 8 and 8A. In one embodiment and as shown, elevationally-outermost surface 66 of recessed dopant-diffusion barrier 62 is formed to be planar, as may be one or both of elevationally-outermost surfaces of recessed central material 64 and recessed lower-stack-channel material 33. In one such embodiment and as shown, elevationally-outermost surfaces of recessed dopant-diffusion barrier 62, recessed laterally-central material 64, and recessed lower-stack-channel material 33 are formed to be co-planar. In one such embodiment, topping material 72*d* is formed directly against such co-planar surfaces. Any other attribute(s) or aspect(s) as shown and/or described herein with respect to other embodiments may be used.

Additionally, and by way of example only, a construction like or analogous to that of FIGS. 9 and 9A may be constructed by forming the upper stack etc. immediately after forming the FIG. 17 construction. Upper channel material 33 may then be deposited into the recesses extending to surfaces 66.

Alternate example processing, for example to produce construction 10*g* as shown in FIGS. 11 and 11A, is next-described with reference to FIGS. 20-26. Like numerals from the above-described embodiments have been used where appropriate, with some construction differences being indicated with the suffix "g" or with different numerals.

Figure 20:
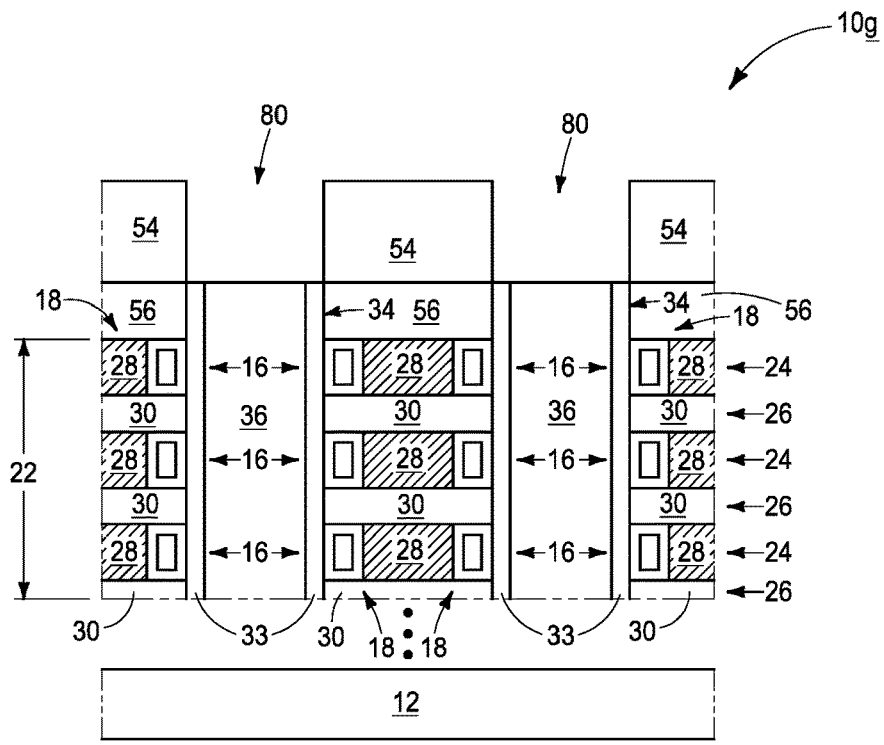
FIG. 20 is a diagrammatic sectional view of a substrate fragment in process in accordance with an embodiment of the invention.

Referring to FIG. 20, such shows example alternate subsequent processing conducted on the substrate of FIG. 13 as compared to that of FIGS. 14 and 15. Specifically, lower-stack-channel material 33 has been recessed within lower opening 80, and in one embodiment as shown to have an elevationally-outermost surface thereof that is planar and in one such embodiment which is co-planar with that of insulator material 36.

Figure 21:
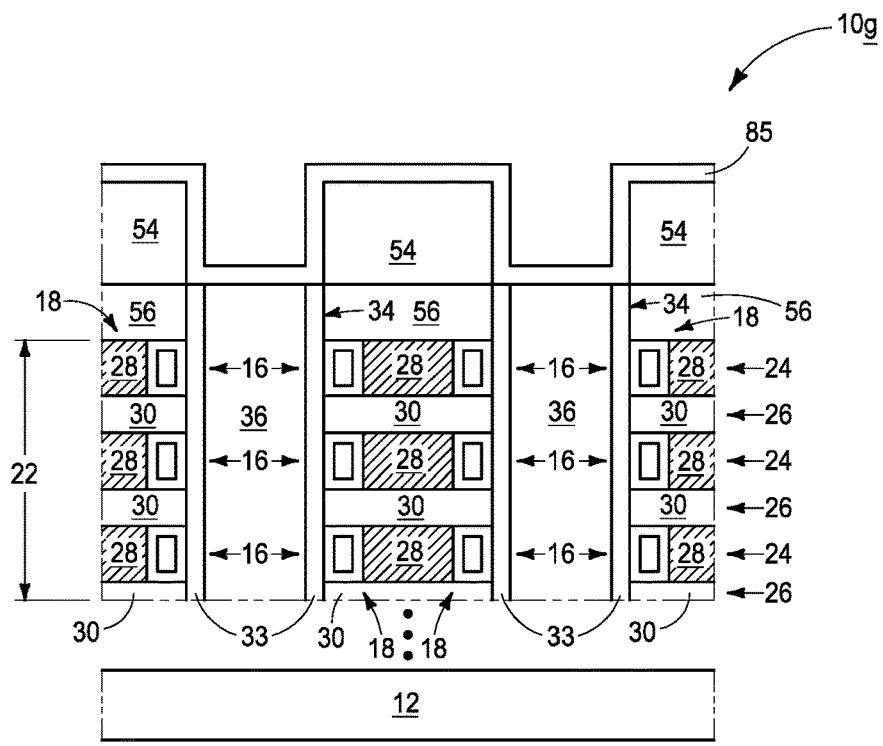
FIG. 21 is a view of the FIG. 20 substrate fragment at a processing step subsequent to that shown by FIG. 20.

Referring to FIG. 21, a material 85 has been formed to line and less-than-fill remaining volume of lower opening 80. Such may comprise a dopant-diffusion-barrier material as described above where, for example, an elevationally innermost portion thereof will be used to form base/bottom 70 as shown in FIGS. 11 and 11A.

Figure 22:
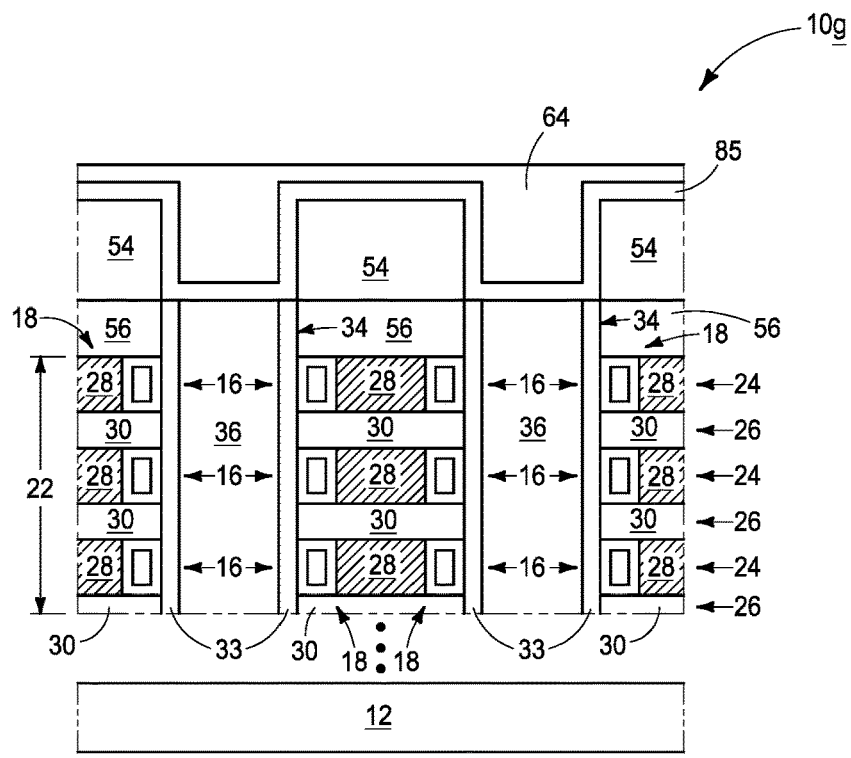
FIG. 22 is a view of the FIG. 21 substrate fragment at a processing step subsequent to that shown by FIG. 21.
Figure 23:
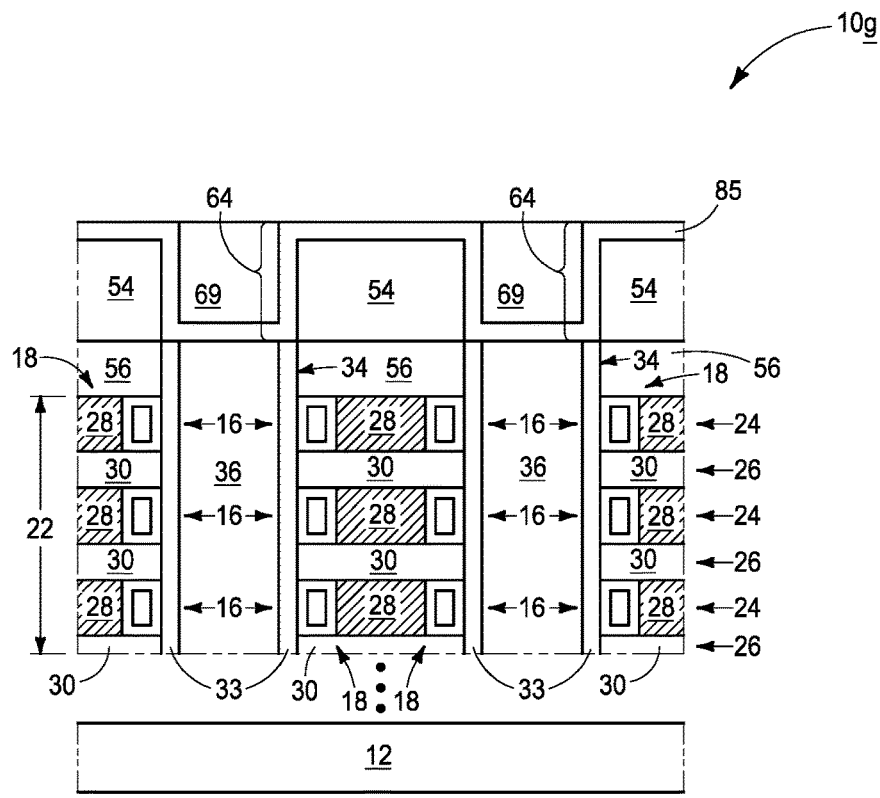
FIG. 23 is a view of the FIG. 22 substrate fragment at a processing step subsequent to that shown by FIG. 22.

Referring to FIG. 22, laterally-central material 64 has been formed in lower opening 80 as shown. Such material 64 comprises an uppermost region 69 having conductivity-modifying dopant therein and a lowermost dopant-diffusion-barrier/base region 70. FIG. 23 shows example planarizing of central material 64 back at least to elevationally-outermost surfaces of material 85.

Figure 24:
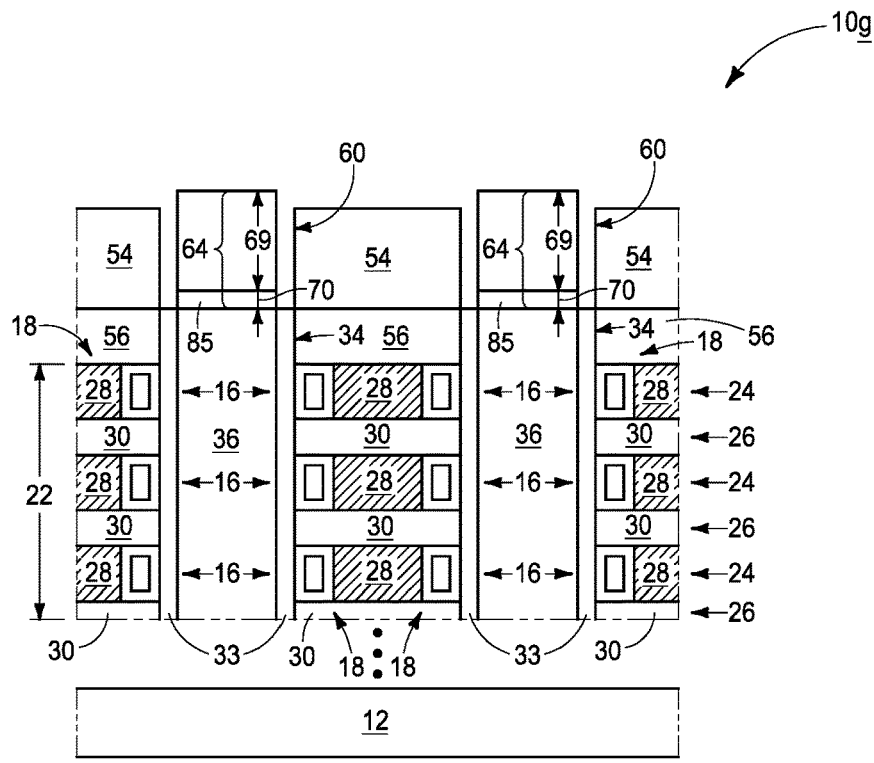
FIG. 24 is a view of the FIG. 23 substrate fragment at a processing step subsequent to that shown by FIG. 23.

Referring to FIG. 24, material 85 (not shown) has been subjected to a suitable anisotropic etch conducted selectively relative to the depicted exposed materials, leaving an annular space about central material 64 in one example.

Figure 25:
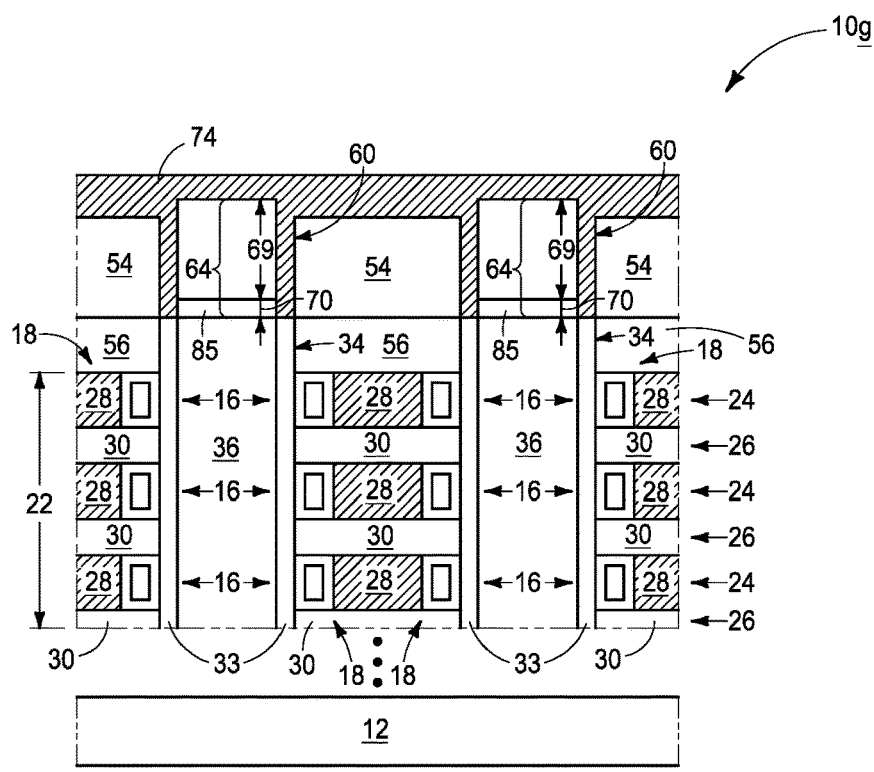
FIG. 25 is a view of the FIG. 24 substrate fragment at a processing step subsequent to that shown by FIG. 24.
Figure 26:
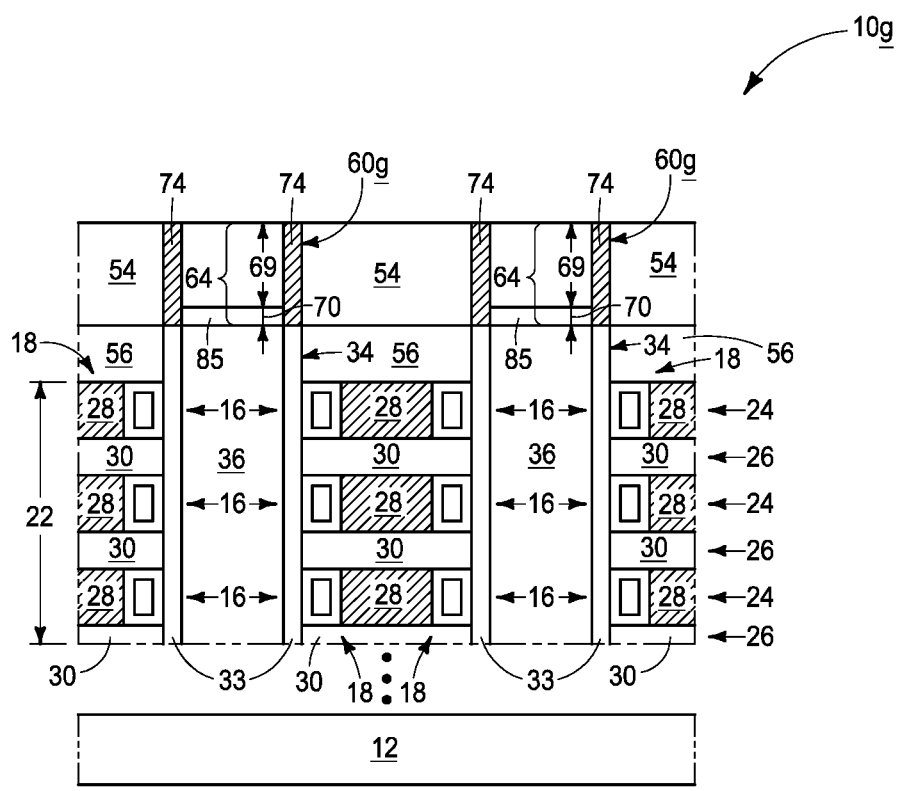
FIG. 26 is a view of the FIG. 25 substrate fragment at a processing step subsequent to that shown by FIG. 25.

Referring to FIG. 25, conductive-side material 74 is formed in lower opening 80 electrically coupled with lower-stack-channel material 33 that is laterally-outward of central material 64. FIG. 26 shows removal of conductive-side material 74 and central material 64 back at least to the elevationally outermost surface of insulator material 54, 56.

Subsequent processing as described above may then occur, for example an upper stack being formed that comprises second-alternating tiers comprising different composition first and second-upper-stack materials elevationally over the lower stack, the laterally-central material in the lower opening, and the conductive material in the lower opening. The upper stack is formed to have an upper opening extending elevationally through multiple of the second-alternating tiers and to at least one of the laterally-central material and the conductive material in the lower opening. Upper-stack-channel material is ultimately formed in the upper opening to be electrically coupled to the lower-stack-channel material through conductive-side material 74 in the lower opening, for example to produce a construction as shown in FIGS. 11 and 11A. Ultimately, control-gate material is provided laterally outward of the respective upper and lower-stack-channel materials. Also, ultimately provided are insulative-charge-passage material, charge-storage material, and a charge-blocking region of individual of the memory cells laterally between the control-gate material and the respective upper and lower-stack-channel materials.

In one embodiment, the conductive material is formed to comprise conductively-doped-semiconductive material and in one embodiment is formed to comprise metal material. In one embodiment, the upper-stack-channel material is formed directly against the laterally-central material, and in one embodiment is formed directly against the conductive material. Any other attribute(s) or aspect(s) as shown and/or described herein with respect to other embodiments may be used.

An embodiment of the invention encompasses a method that is part of a method of forming an elevationally-extending string of memory cells. Such comprises forming an intervening structure that is elevationally between upper and lower stacks that respectively comprise alternating tiers comprising different composition materials. The intervening structure is formed to comprise an elevationally-extending-dopant-diffusion barrier and laterally-central material that is laterally inward of the dopant-diffusion barrier and has dopant therein. Some of the dopant from the laterally-central material is thermally diffused into upper-stack-channel material (e.g., inherently occurring in subsequent processing and/or by exposing the substrate to 200° C. to 1,500° C. for 10 seconds to 10 hours in an inert atmosphere). The dopant-diffusion barrier is used during the thermally diffusing to cause more thermal diffusion of said dopant into the upper-stack-channel material than diffusion of said dopant, if any, into lower-stack-channel material. Alternately stated or considered, the dopant-diffusion barrier functions as an asymmetric diffusion barrier that is used during the thermally diffusing to cause more thermal diffusion of said dopant into the upper-stack-channel material than diffusion of said dopant, if any, into lower-stack-channel material.

In one embodiment, the intervening structure is formed to comprise dopant-transmissive-topping material above an elevationally-outermost surface of the dopant-diffusion barrier. In such embodiment, the thermally diffusing comprises diffusing some of the dopant from the laterally-central material through the dopant-transmissive-topping material and into the upper-stack-channel material. Any other attribute(s) or aspect(s) as shown and/or described herein with respect to other embodiments may be used.

In this document, "elevationally-extending" and "extending elevationally" refer to a direction that is angled away by at least 45° from a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further in this document unless otherwise stated, "elevational(ly)", "higher", "upper", "lower", "top", "atop", "bottom", "above", "below", "under", "beneath", "up", and "down" are generally with reference to the vertical direction. Also, "elevationally-extending" and "extending elevationally" with respect to a field effect transistor is with reference to orientation of the transistor's channel length along which current flows in operation between the source/drain regions.

Further, "directly above" requires at least some lateral overlap (i.e., horizontally) of two stated regions/materials/components relative one another. Further, use of "above" not preceded by "directly" only requires that some portion of the stated region/material/component that is above the other be elevationally outward of the other (i.e., independent of whether there is any lateral overlap of the two stated regions/materials/components pillars)

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Further, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a method that is part of a method of forming an elevationally-extending string of memory cells comprises forming an intervening structure that is elevationally between upper and lower stacks that respectively comprise alternating tiers comprising different composition materials. The intervening structure is formed to comprise an elevationally-extending-dopant-diffusion barrier and laterally-central material that is laterally inward of the dopant-diffusion barrier and has dopant therein. Some of the dopant is thermally diffused from the laterally-central material into upper-stack-channel material. The dopant-diffusion barrier during the thermally diffusing is used to cause more thermal diffusion of said dopant into the upper-stack-channel material than diffusion of said dopant, if any, into lower-stack-channel material.

In some embodiments, a method of forming an elevationally-extending string of memory cells comprises forming a lower stack comprising first-alternating tiers comprising different composition first and second-lower-stack materials, insulator material above the lower stack, and a lower opening extending through the insulator material and multiple of the first-alternating tiers. Lower-stack-channel material is formed in the lower opening. The lower-stack-channel material comprises an elevationally-outermost portion that is against sidewalls of the lower opening and less-than-fills an elevationally-outermost portion of the lower opening. An elevationally-extending-dopant-diffusion barrier is formed around the lower opening laterally inward of the elevationally-outermost portion of the lower-stack-channel material. Remaining volume of the lower opening is filled with a laterally-central material that is laterally inward of the dopant-diffusion barrier. After the filling, the dopant-diffusion barrier is elevationally recessed relative to an elevationally-outermost surface of the insulator material that is adjacent the lower opening to form the dopant-diffusion barrier to have an elevationally-outermost surface that is lower than the elevationally-outermost surface of the insulator material that is adjacent the lower opening. Topping material is formed above the elevationally-outermost surface of the recessed dopant-diffusion barrier. An upper stack comprising second-alternating tiers comprising different composition first and second-upper-stack materials is formed elevationally over the lower stack and the topping material. The upper stack has an upper opening extending elevationally through multiple of the second-alternating tiers and to the topping material. Upper-stack-channel material is formed in the upper opening and that is electrically coupled with the lower-stack-channel material. Control-gate material is provided laterally outward of the respective upper and lower-stack-channel materials. Also provided are insulative-charge-passage material, charge-storage material, and a charge-blocking region of individual of the memory cells laterally between the control-gate material and the respective upper and lower-stack-channel materials.

In some embodiments, a method of forming an elevationally-extending string of memory cells comprises forming a lower stack comprising first-alternating tiers comprising different composition first and second-lower-stack materials, insulator material above the lower stack, and a lower opening extending through the insulator material and multiple of the first-alternating tiers. Lower-stack-channel material is formed in the lower opening. Laterally-central material is formed in the lower opening and comprises an uppermost region having dopant therein and a lowermost dopant-diffusion-barrier region. Conductive material is formed in the lower opening electrically coupled with the lower-stack-channel material that is laterally-outward of the laterally-central material. An upper stack comprising second-alternating tiers comprising different composition first and second-upper-stack materials is formed elevationally over the lower stack, the laterally-central material in the lower opening, and the conductive material in the lower opening. The upper stack has an upper opening extending elevationally through multiple of the second-alternating tiers and to at least one of the laterally-central material and the conductive material in the lower opening. Upper-stack-channel material is formed in the upper opening and that is electrically coupled with the lower-stack-channel material through the conductive material in the lower opening. Control-gate material is provided laterally outward of the respective upper and lower-stack-channel materials. Also provided are insulative-charge-passage material, charge-storage material, and a charge-blocking region of individual of the memory cells laterally between the control-gate material and the respective upper and lower-stack-channel materials.

In some embodiments, an elevationally-extending string of memory cells comprises an upper stack elevationally over a lower stack, with the upper and lower stacks individually comprising vertically-alternating tiers comprising control-gate material vertically alternating with insulating material. An upper-stack-channel pillar extends through multiple of the vertically-alternating tiers in the upper stack and a lower-stack-channel pillar extends through multiple of the vertically-alternating tiers in the lower stack. Insulative-charge-passage material, charge-storage material, and a charge-blocking region of individual of the memory cells is laterally between the respective upper and lower-stack-channel pillars and the control-gate material. A conductive interconnect is elevationally between and electrically couples the upper and lower-stack-channel pillars together. The conductive interconnect comprises an elevationally-extending-dopant-diffusion barrier laterally outward of a laterally-central material. The dopant-diffusion barrier has an elevationally-outermost surface that is lower than an elevationally-outermost surface of the conductive interconnect. Conductive-topping material is above the elevationally-outermost surface of the dopant-diffusion barrier. An elevationally-extending-side material is laterally outward of the dopant-diffusion barrier, with the side material being at least one of conductive and semiconductive.

In some embodiments, an elevationally-extending string of memory cells comprises an upper stack elevationally over a lower stack, with the upper and lower stacks individually comprising vertically-alternating tiers comprising control-gate material vertically alternating with insulating material. An upper-stack-channel pillar extends through multiple of the vertically-alternating tiers in the upper stack and a lower-stack-channel pillar extends through multiple of the vertically-alternating tiers in the lower stack. Insulative-charge-passage material, charge-storage material, and a charge-blocking region of individual of the memory cells are laterally between the respective upper and lower-stack-channel pillars and the control-gate material. An intervening structure is elevationally between the upper and lower stacks. The intervening structure comprises a laterally-central material having conductivity-modifying dopant therein and an elevationally-extending-dopant-diffusion barrier laterally outward of the laterally-central material. The dopant-diffusion barrier has an elevationally-outermost surface that is lower than an elevationally-outermost surface of the intervening structure. Topping material is above the elevationally-outermost surface of the dopant-diffusion barrier, with the topping material being dopant transmissive. Conductively-doped-semiconductive material is elevationally between the upper-stack channel pillar and the lower-stack channel pillar aside the topping material.

In some embodiments, an elevationally-extending string of memory cells comprises an upper stack elevationally over a lower stack, with the upper and lower stacks individually comprising vertically-alternating tiers comprising control-gate material vertically alternating with insulating material. An upper-stack-channel pillar extends through multiple of the vertically-alternating tiers in the upper stack and a lower-stack-channel pillar extends through multiple of the vertically-alternating tiers in the lower stack. Insulative-charge-passage material, charge-storage material, and a charge-blocking region of individual of the memory cells are laterally between the respective upper and lower-stack-channel pillars and the control-gate material. A conductive interconnect is elevationally between and electrically couples the upper and lower-stack-channel pillars together. The conductive interconnect comprises conductive-side material laterally outward of and extending elevationally along a laterally-central material. The lower-stack-channel pillar being directly against the conductive-side material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an elevationally-extending string of memory cells, comprising:
    forming a lower stack comprising first-alternating tiers comprising different composition first- and second-lower-stack materials;
    forming an insulator material above the lower stack;
    forming a lower opening extending through the insulator material and multiple tiers comprised by the first-alternating tiers;
    forming a lower-stack-channel material within the lower opening, the lower-stack-channel material being formed along the first-alternating tiers and along the insulator material;
    forming an insulative material within a lower portion and an upper portion of the lower opening;
    recessing the insulative material within the lower opening to form an upper area of the lower opening that is unfilled;
    forming a dopant-diffusion barrier along sidewalls of the upper area within the lower opening laterally inward of the lower-stack-channel material;
    after forming the dopant-diffusion barrier, filling a remaining volume of the upper area within the lower opening with a laterally-central material;
    after the filling, recessing an uppermost surface of the dopant-diffusion barrier relative to an elevationally-outermost surface of the insulator material to form a recessed surface of the dopant-diffusion barrier;
    forming a topping material above the recessed surface of the dopant-diffusion barrier;
    forming an upper stack comprising second-alternating tiers comprising first- and second-upper-stack materials elevationally over the lower stack and the topping material, the first-upper-stack material differing in composition relative to the second-upper-stack material, the upper stack having an upper opening extending elevationally through multiple tiers comprised by the second-alternating tiers and to an elevational level of an upper surface of the topping material;
    forming an upper-stack-channel material within the upper opening and electrically coupled with the lower-stack-channel material;
    providing a first control-gate material within the first-alternating tiers;
    providing a second control-gate material within the second-alternating tiers;
    providing first insulative-charge-passage material, first charge-storage material, and a first charge-blocking region of individual memory cells comprised by the elevationally-extending string of memory cells laterally between the second control-gate material and the upper-stack-channel material; and
    providing second insulative-charge-passage material, second charge-storage material, and a second charge-blocking region of individual memory cells comprised by the elevationally-extending string of memory cells laterally between the first control-gate materials and the lower-stack-channel material.

2. The method of claim 1 wherein the topping material is formed directly against the recessed surface of the dopant-diffusion barrier.

3. The method of claim 1 wherein the recessing of the dopant-diffusion barrier forms the recessed surface to be elevationally lower than an elevationally-outermost surface of the laterally-central material.

4. The method of claim 1 wherein the recessing of the dopant-diffusion barrier forms the recessed surface to be elevationally lower than an elevationally-outermost surface of the lower-stack-channel material.

5. The method of claim 1 wherein the recessing of the dopant-diffusion barrier forms the recessed surface to be elevationally lower than an elevationally-outermost surface of the laterally-central material and elevationally lower than an elevationally-outermost surface of the lower-stack-channel material.

6. The method of claim 5 comprising forming the upper-stack-channel material above the dopant-diffusion barrier laterally between the dopant-diffusion barrier and the lower-stack-channel material.

7. The method of claim 6 comprising forming the upper-stack-channel material directly against the elevationally-outermost surface of the laterally-central material.

8. The method of claim 1 comprising, after the filling, elevationally recessing the laterally-central material and the lower-stack-channel material relative to the elevationally-outermost surface of the insulator material.

9. The method of claim 8 comprising forming the topping material directly against elevationally-outermost surfaces of the laterally-central material and the lower-stack-channel material and directly against the elevationally-outermost surface of the recessed surface of the dopant-diffusion barrier.

10. The method of claim 8 wherein the elevationally recessing of the laterally-central material and the lower-stack-channel material occurs during the elevationally recessing of the dopant-diffusion barrier.

11. The method of claim 10 wherein,
    the recessed surface of the recessed dopant-diffusion barrier is formed to be planar;
    the recessed laterally-central material is formed to comprise a planar-elevationally-outermost surface;
    the recessed lower-stack-channel material is formed to comprise a planar-elevationally-outermost surface; and
    the recessed surface of the dopant-diffusion barrier, the recessed laterally-central material, and the recessed lower-stack-channel material are formed to be co-planar.

12. The method of claim 11 comprising forming the topping material directly against the co-planar surfaces.

13. The method of claim 1 wherein the laterally-central material has conductivity-modifying dopant therein, and further comprising:
    thermally diffusing some of the conductivity-modifying dopant from the laterally-central material into the upper-stack-channel material, using the dopant-diffusion barrier during the thermally diffusing to cause a greater amount of said conductivity-modifying dopant to diffuse into the upper-stack-channel material than into the lower-stack-channel material.

* * * * *